(12) United States Patent
Chan et al.

(10) Patent No.: US 7,697,655 B2
(45) Date of Patent: Apr. 13, 2010

(54) SHIFT REGISTER AND LEVEL CONTROLLER

(75) Inventors: Chien-Ting Chan, Changhua County (TW); Wen-Chun Wang, Taichung (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 12/101,207

(22) Filed: Apr. 11, 2008

(65) Prior Publication Data
US 2008/0253499 A1 Oct. 16, 2008

(30) Foreign Application Priority Data
Apr. 11, 2007 (TW) .............................. 96112779 A

(51) Int. Cl.
*G11C 19/00* (2006.01)
(52) U.S. Cl. .............................. 377/64; 377/68; 377/69
(58) Field of Classification Search .................... 377/64, 377/68–70, 73, 74, 77–80
See application file for complete search history.

(56) References Cited
U.S. PATENT DOCUMENTS

| | | | |
|---|---|---|---|
| 6,970,530 B1 * | 11/2005 | Wang et al. .................... 377/69 |
| 7,436,923 B2 * | 10/2008 | Tobita .......................... 377/64 |
| 7,532,701 B2 * | 5/2009 | Moon ........................... 377/68 |
| 2006/0001637 A1 * | 1/2006 | Pak et al. ...................... 345/100 |
| 2006/0291610 A1 * | 12/2006 | Lo et al. ........................ 377/64 |
| 2008/0101529 A1 * | 5/2008 | Tobita .......................... 377/64 |

* cited by examiner

*Primary Examiner*—Tuan Lam
(74) *Attorney, Agent, or Firm*—Thomas, Kayden, Horstemeyer & Risley

(57) ABSTRACT

A shift register includes several stages of shift register units. Each shift register unit includes a first level lifting unit, first level lowering unit, first driving unit and level controller. The first level lifting unit and first level lowering unit control the scan signal to be equal to a first timing signal and first voltage, respectively. The level controller includes an input unit, a charge storage unit, a second level lifting unit and a second level lowering unit. The input unit controls the third control signal to be equal to the first voltage at a node. The charge storage unit stores a voltage of the timing signal at the node. The second level lifting unit and second level lowering unit respectively control the second control signal to be equal to the third control signal and the first voltage to turn on and turn off the first level lowering unit.

12 Claims, 33 Drawing Sheets

SHIFT REGISTER AND LEVEL CONTROLLER

This application claims the benefit of Taiwan application Serial No. 096112779, filed Apr. 11, 2007, the subject matter of which is incorporated herein by reference.

BACKGROUND OF THE INVENTION

1. Field of the Invention

The invention relates in general to a shift register, and more particularly to a shift register, which has a level controller performing a level control operation by using charging storage ability of capacitors.

2. Description of the Related Art

Along with increasing technology development, nowadays, the liquid crystal display (LCD) has been widely applied to electronic display products, such as TV, computer monitors, notebook computers, mobile phones or personal digital assistants. The LCD includes a data driver, a scan driver and a liquid crystal display panel. The display panel has a pixel matrix. The scan driver is for sequentially enabling the corresponding pixel rows in the pixel matrix for transmitting pixel data outputted by the data driver to the corresponding pixels so as to display the required images.

In today's technology, normally, a shift register is used to implement the function of the scan driver for sequentially enabling the corresponding pixel rows in the pixel matrix and the level controller 100 (in FIG. 1) of each stage of shift register unit is designed by using two transistors differing by a large W/L ratio. As shown in FIG. 1, the W/L ratio of the transistor T5' is ten times of that of the transistor T4'. The transistor T4' is biased to be a diode. Therefore, the level controller 100 can generate an output signal Vg having an inverse phase to an input signal Vs in response to the input signal Vs.

However, owing that the transistor T4' has a smaller W/L ratio, the transistor T4' has to bear a larger current generated by the transistor T5', which causes the shift register unit to generate an error operation and shortens the lifetime of the LCD. Therefore, how to design a level controller and shift register with longer lifetime so as to improve the lifetime and frame quality of the LCD is one of the essential targets in the relevant industrial development.

SUMMARY OF THE INVENTION

The invention is directed to a shift register, which can effectively improve the short-lifetime drawback of the conventional shift register and has the advantage of having longer lifetime and increasing the lifetime and frame quality of the LCD using the shift register.

According to a first aspect of the present invention, a shift register is provided. The shift register comprises a number of stages of shift register units. Each stage of shift register unit generates a scan signal and comprises a first level lifting unit, a first level lowering unit, a first driving unit and a level controller. The first level lifting unit is for controlling the scan signal to be equal to a first timing signal in response to a high level of a first control signal. The first level lowering unit is for controlling the scan signal to be equal to a first voltage in response to a high level of a second control signal. The first driving unit is for providing the first control signal to turn on the first level lifting unit in response to a rising edge of an input signal. The level controller is for receiving the first control signal and accordingly outputting a third control signal at an output terminal. The level controller comprises an input unit, a charge storage unit, a second level lifting unit and a second level lowering unit. The input unit is for controlling the third control signal to be equal to the first voltage at a first node in response to a rising edge of the first control signal. The charge storage unit has one end coupled to the first node and the other end for receiving a second timing signal. The charge storage unit is for storing a voltage of the timing signal relative to the first node. The second level lifting unit is for controlling the second control signal to be substantially equal to the third control signal so as to turn on the first level lowering unit in response to a rising edge of the third control signal. The second level lowering unit is for controlling the second control signal to be equal to the first voltage so as to turn off the first level lowering unit in response to the rising edge of the first control signal. The input signal is a scan signal outputted by a stage of shift register unit previous to the corresponding stage of shift register unit.

According to a second aspect of the present invention, a level controller is provided. The level controller comprises an input unit, a charge storage unit, a level lifting unit, and level lowering unit. The input unit is for controlling a control signal to be equal to a first voltage at a node in response to a rising edge of an input signal. The charge storage unit has one end coupled to the node and the other end for receiving a timing signal, wherein the charge storage unit is for storing a voltage of the timing signal relative to the node. The level lifting unit is for providing a timing signal to an output terminal in response to a rising edge of the control signal so as to output a scan signal. The level lowering unit is for controlling the output signal to be equal to the first voltage in response to the rising edge of the input signal.

The invention will become apparent from the following detailed description of the preferred but non-limiting embodiments. The following description is made with reference to the accompanying drawings.

DETAILED DESCRIPTION OF THE INVENTION

Embodiment One

Figure 1:
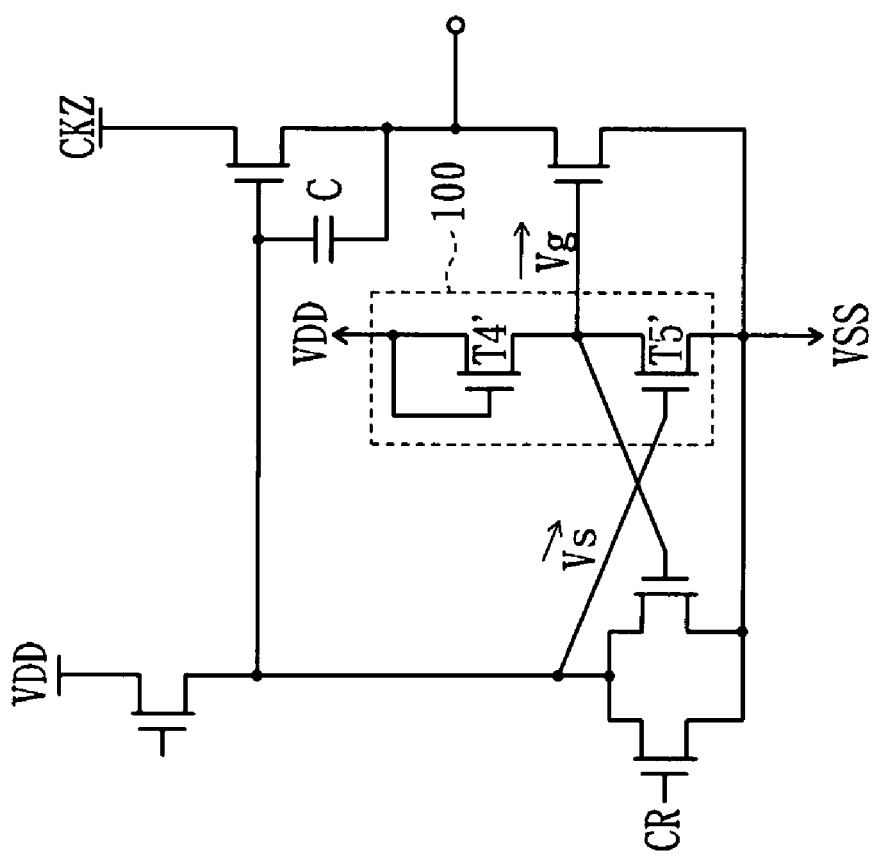
FIG. 1 is a circuit diagram of a conventional shift register unit.
Figure 2:
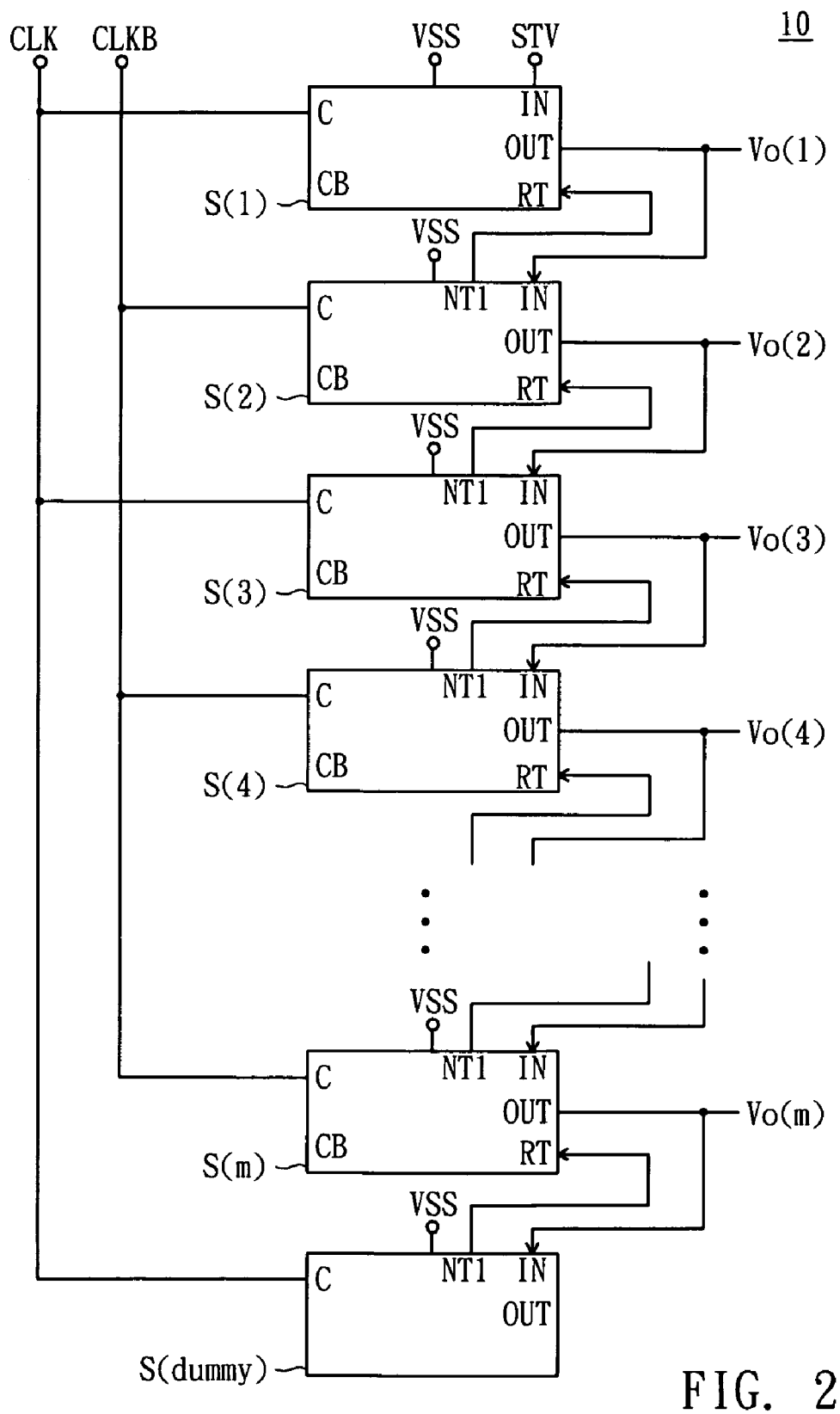
FIG. 2 is a block diagram of a shift register according to a first embodiment of the invention.

Referring to FIG. 2, a block diagram of a shift register according to a first embodiment of the invention is shown. A shift register 10 includes m shift register units S(1)-S(m) coupled in series to each other and having the same structure for instance. In the embodiment, each of the shift register units S(1)-S(m) includes an input terminal IN, an output terminal OUT, a control terminal RT, a node NT1, and a timing terminal C. The input terminal IN of the shift register unit S(1) receives a start signal STV and the input terminals IN of the shift register units S(2)-S(m) sequentially receive the scan signals Vo(1)-Vo(m−1) outputted by the output terminal of the previous stage of shift register units S(1)-S(m−1), respectively.

In the shift register units S(1)-S(m), the timing signals received by any two adjacent timing terminals C have staggered enabling time In the embodiment, the timing terminal C of the odd-stage ones in the shift register units S(1)-S(m) are exemplified to receive timing signal CLK while the timing terminal C of the even-stage ones are exemplified to receive timing signal CLKB for illustration. In the embodiment, the enabling time of the timing signals CLKB and CLK is staggered and the timing signal CLKB is inverse in phase to the timing signal CLK for instance.

The control terminals RT of the shift register units S(1)-S(m−1) respectively receive voltage signals at the nodes NT1 of the shift register units S(2)-S(m) to be control signals Vc1(1)-Vc1(m−1). In the following description, the n-th stage of shift register unit S(n) is exemplified for illustrating a number of examples for implementing the shift register unit.

Example One

Figure 3:
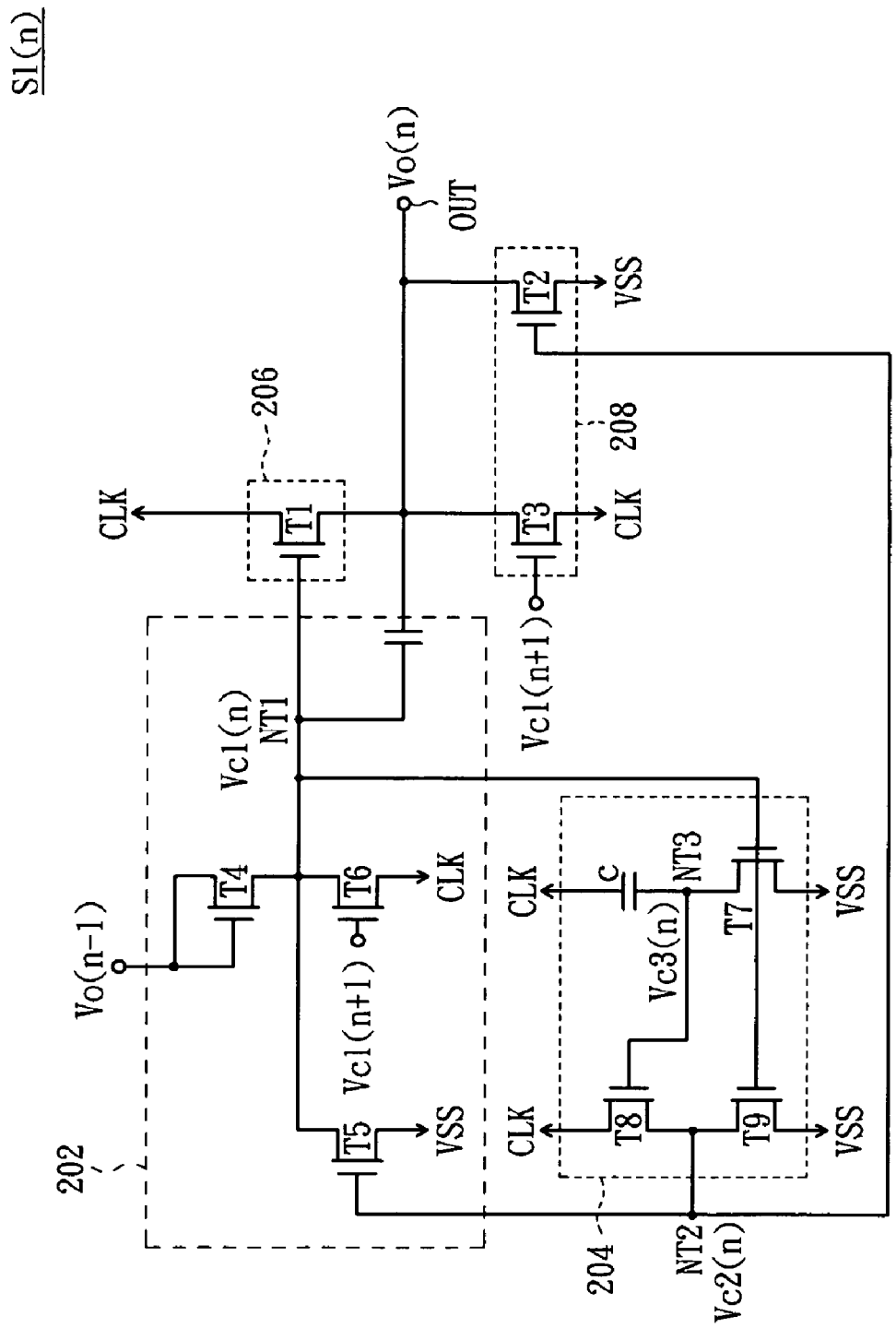
FIG. 3 is a detailed circuit diagram of the shift register unit S(n) in FIG. 2 according to the first example of the first embodiment.

Referring to FIG. 3, a detailed circuit diagram of the shift register unit S(n) in FIG. 2 according to the first example of the invention is shown. A shift register unit S1(n), such as S(1) shown in FIG. 2, includes a driving unit 202, a level controller 204, a level lifting unit 206 and a level lowering unit 208. In the example, the level lifting unit 206, the level lowering unit 208 and the driving unit 202 are exemplified to respectively include transistors T1, T2, T3 and T4-T6 for illustration. The transistors T1-T6 are N-type thin film transistors (TFTs) for instance.

The transistor T1 has a gate coupled to the node NT1 for receiving the control signal Vc1(n), a drain for receiving the timing signal CLK, and a source coupled to the output terminal OUT. The transistor T1 controls the scan signal Vo(n) to be equal to the timing signal CLK in response to the control signal Vc1(n). The transistor T2 has a gate coupled to the node NT2 for receiving the control signal Vc2(n), a drain coupled to the output terminal OUT and a source for receiving a voltage VSS. The transistor T3 has a gate for receiving the control signal Vc1(n+1) of the (n+1)-th stage of shift register unit S1(n+1), a drain coupled to the output terminal OUT and a source for receiving the voltage VSS. The transistors T2 and T3 control the scan signal Vo(n) to be equal to the voltage VSS in response to the control signals Vc2(n) and Vc1(n+1), respectively. The voltage VSS of the example is a minimum voltage of the shift register 10 for instance.

The transistor T4 has a gate and a drain for receiving the scan signal Vo(n−1) outputted by the (n−1)-th stage of shift register unit S1(n−1) and a source coupled to the node NT1. The transistor T4 controls the control signal Vc1(n) to have a level close to a high level of the scan signal Vo(n−1) so as to turn on the transistor T1 in response to a rising edge of the scan signal Vo(n−1). The high level of the scan signal Vo(n−1) is equal to the voltage VDD, a maximum voltage of the shift register 10 for instance.

The gates of the transistors T5 and T6 respectively receive the control signal Vc2(n) and the control signal Vc1(n+1) of the (n+1)-th stage of shift register unit S1(n+1). The drains of the transistors T5 and T6 are coupled to the node NT1. The sources of the transistors T5 and T6 respectively receive the voltage VSS and the timing signal CLK. The transistors T5 and T6 control the control signal Vc1(n) to be the voltage VSS so as to turn off the transistor T1 in response to the control signals Vc2(n) and Vc1(n+1), respectively.

The level controller 204 includes an input unit, a charge storage unit, a level lifting unit and a level lowering unit. The input unit, charge storage unit, level lifting unit and level lowering unit are exemplified to respectively include a transistor T7, a capacitor C, a transistor T8 and a transistor T9 for illustration in the embodiment. The transistors T7-T9 are N-type TFTs for instance. The transistor T7 has a gate for receiving the control signal Vc1(n), a drain coupled to a node NT3 and a source for receiving the voltage VSS. The transistor T7 controls the control signal Vc3(n) to be equal to the voltage VSS at the node NT3 in response to a rising edge of the control signal Vc1(n).

The capacitor C has one end coupled to the node NT3 and the other end for receiving the timing signal CLK. The capacitor C is for storing an electric charge induced by the timing signal CLK, such as storing a voltage close to the voltage difference between the voltage of the timing signal CLK and the voltage at the node NT3 that is induced by the timing signal CLK. The transistor T8 has a gate for receiving the control signal Vc3(n), a drain for receiving the timing signal CLK and a source coupled to the node NT2. The transistor T8 controls the control signal Vc2(n) in response to a rising edge of the control signal Vc3(n). At the time, the voltage level of Vc2(n) gets close to the voltage level of the control signal Vc3(n) to turn on the level lowering unit 208. The transistor T1 has a gate for receiving the control signal Vc1(n), a drain coupled to the node NT2 and a source for receiving the voltage VSS. The transistor T9 is for controlling the control signal Vc2(n) to be equal to the voltage VSS so as to turn off the level lowering unit 208 in response to the rising edge of the control signal Vc1(n).

Figure 4A:
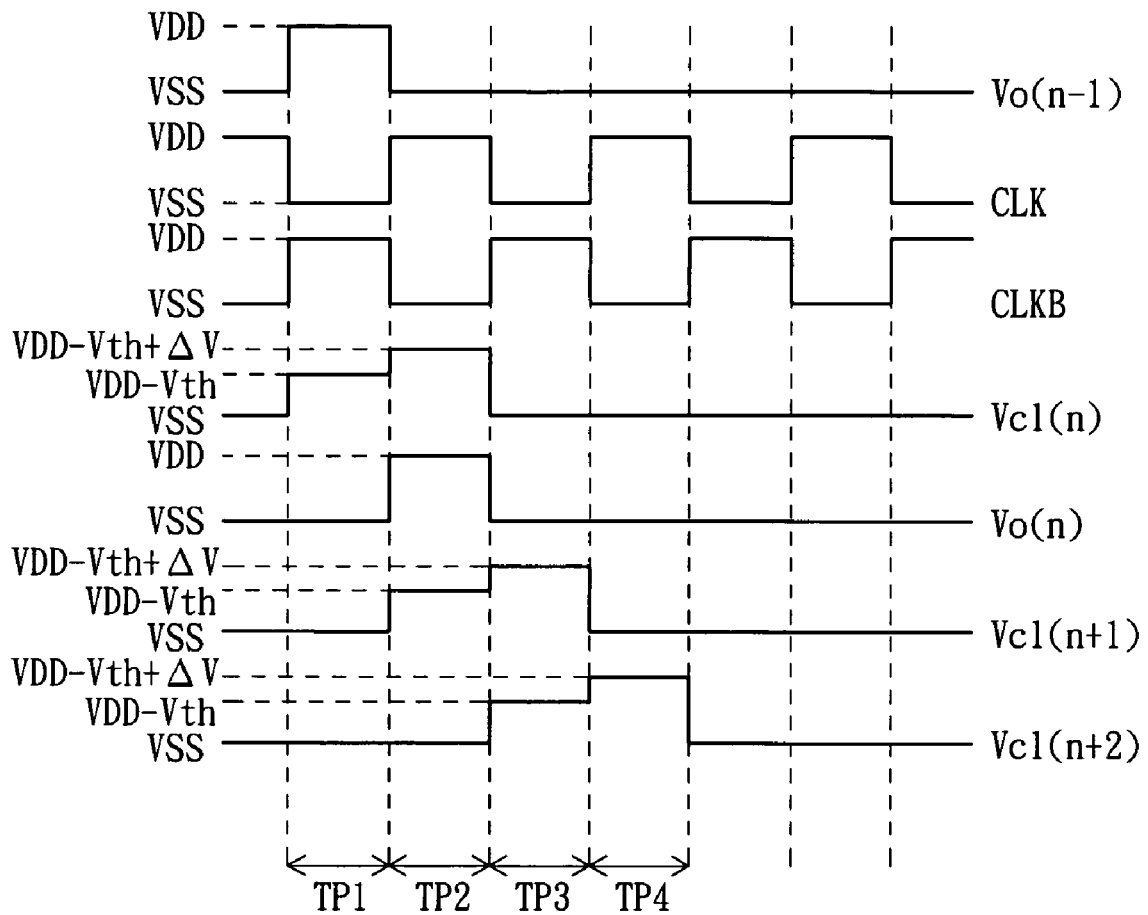
FIG. 4A is a timing diagram of the relevant signals in the shift register unit S1(n) of FIG. 3.

Referring to FIG. 4A, a timing diagram of the relevant signals in the shift register unit S1(n) of FIG. 3 is shown. In the time period TP1, the output signal Vo(n−1) and the timing signal CLKB are equal to the voltage VDD, and the timing signal CLK and the control signal Vc1(n+1) are equal to the voltage VSS. At the time, the transistors T3, T5 and T6 are turned off, and the transistor T4 is turned on such that the transistor T1 is also turned on and the scan signal Vo(n) is equal to the timing signal CLK, which has the level of the voltage VSS. The transistor T4 controls the control signal Vc1(n) to be (VDD-Vth1) to turn on the transistors T7 and T9 such that the controls signals Vc2(n) and Vc3(n) are both equal to the voltage VSS and the transistor T2 is turned off. At the time, the voltage drop across the capacitor C is substantially equal to 0, wherein Vth1 is a threshold voltage of the transistor T1.

In the time period TP2, the output signal Vo(n−1) and the timing signal CLKB are equal to the voltage VSS, and the timing signal Vc1(n+1) and the timing signal CLK are close to the voltage VDD. At the time, the transistors T4-T6 are turned off and the node NT1 is floating. In the time period TP2, the timing signal CLK is lifted up to have the voltage VDD from the voltage VSS, and this large voltage variation causes the voltage signal Vc1(n) to increase by a difference voltage ΔV due to the boot-strapping effect. As a result, the voltage signal Vc1(n)=VDD−Vth1+ΔV. In the embodiment, the difference voltage ΔV is equal to:

$$\Delta V = \frac{C_{gs}}{C_{p1} + C_{gs}}(VDD - VSS),$$

wherein Cgs is a parasitic capacitance of the transistor T1, and the Cp1 is an equivalent capacitance seen from the node NT1. At the time, the control signals Vc2(n) and Vc3(n) are both equal to the voltage VSS and the control signal Vc1(n+1) is equal to the voltage VDD-Vth1. Thus, the transistors T8, T2 and T3 are turned off and the transistor T1 quickly charges the scan signal Vo(n) to the voltage VDD. Moreover, the scan signal Vo(n)=VDD is then inputted into the input terminals IN of the next stage of shift register unit S1(n+1), such as S(2) shown in FIG. 2; meanwhile, the next stage of shift register unit S1(n+1) receives timing signal CLKB instead of CLK. At the time, the voltage drop across the capacitor C is close to a difference between the voltages VDD and VSS.

In the time period TP3, the control signal Vc1(n+1) and the timing signal CLKB are close to the voltage VDD, and the output signal Vo(n−1) and the timing signal CLK are equal to the voltage VSS. At the time, the transistor T6 is turned on such that the control signal Vc1(n) is equal to the voltage VSS and the transistors T1, T7 and T9 are turned off. In response to the falling edge of the timing signal CLK, the capacitor C is discharged, the voltage level of the control signal Vc3(n) after forming a protruding wave is substantially close to the level of the timing signal CLK, that is, the voltage VSS, and the transistor T8 is turned off. At the time, the voltage drop across the capacitor C is close to 0V. The node NT2 is substantially floating, the control signal Vc2(n) is equal to VSS and the transistor T2 is turned off.

In the time period TP4, the timing signal CLK is close to the voltage VDD, and the timing signal Vc1(n+1), the output signal Vo(n−1) and the timing signal CLKB are equal to the voltage VSS. At the time, the transistors T1, T4, T7 and T9 are remained turned off and the transistors T3 and T6 are also turned off. In response to a rising edge of the timing signal CLK, the control signal Vc3(n) has a level VDD' substantially close to the level of the timing signal CLK, that is, the voltage VDD' to turn on the transistor T8. At the time, the control signal Vc2(n) is substantially close to the control signal Vc3(n), that is, close to the voltage VDD'. As a result, the transistor T2 is turned on and the scan signal Vo(n) is equal to the voltage VSS.

Figure 4B:
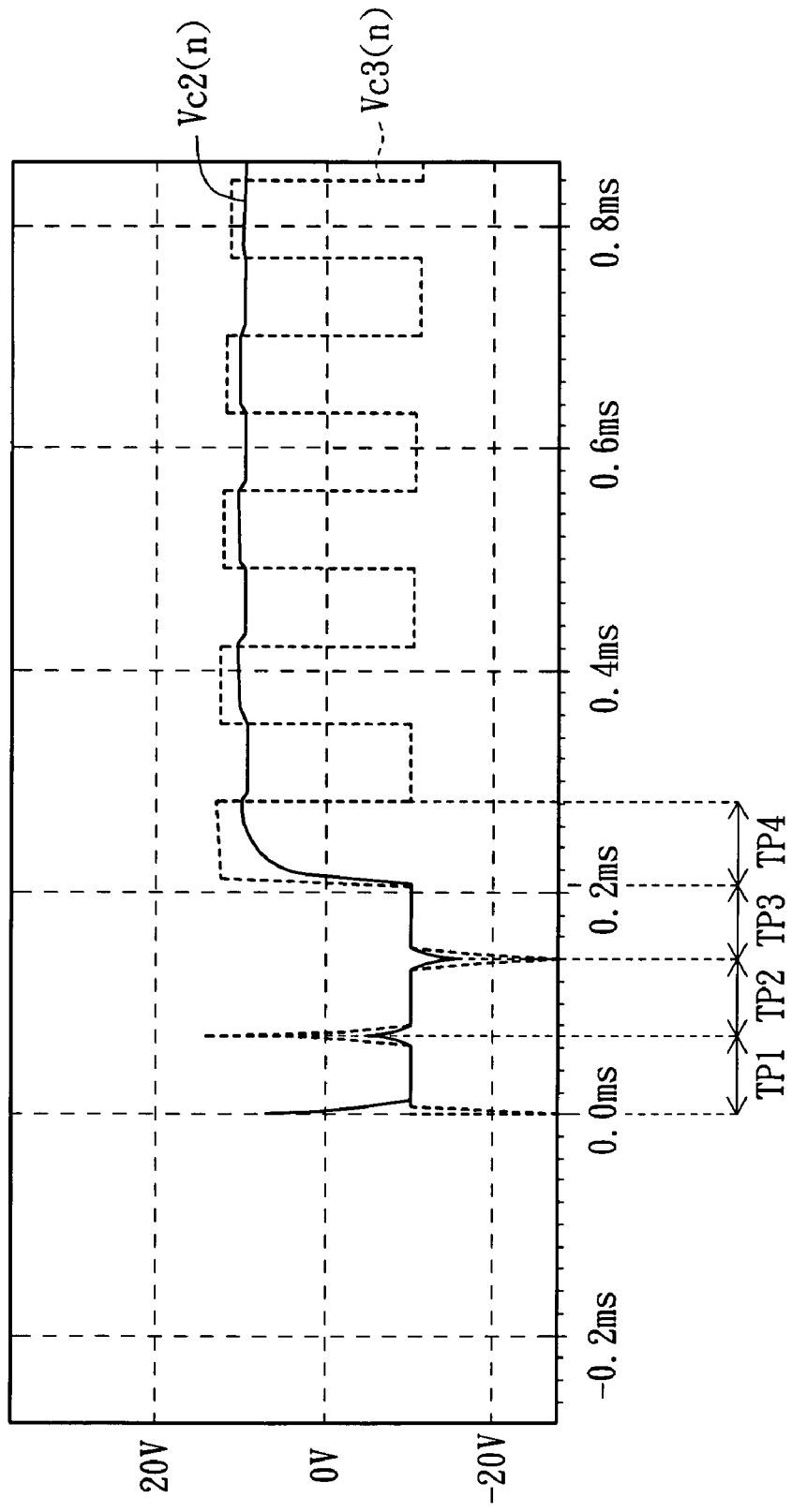
FIG. 4B is a signal stimulation diagram of the control signals Vc2(n) and Vc3(n) in FIG. 3.

Referring to FIG. 4B, a signal stimulation diagram of the control signals Vc2(n) and Vc3(n) in FIG. 3 is shown. The transistors T7-T9 have a W/L ratio equal to 50/5 and the capacitor C has a capacitance equal to 0.5 pF for instance. From the above description, it can be known that the shift register S1(n) of the example can generate a high-level control signal Vc2(n) to turn on the transistor T4 and equalize the scan signal Vo(n) with the voltage VSS to achieve the implementation of the shift register unit S1(n) by using the level controller 204 in the time period TP4. Owing that the level controller 204 of the example responses the control signal Vc1(n) to provide the control signal Vc2(n) with inverse phase to the control signal Vc1(n) through charging and discharging of the capacitor C and function of the timing signal CLK. Therefore, the level controller 204 in the example can effectively solve the issue that the transistor T4' of the level controller 100 of the conventional shift register is damaged as too high current flows by due to size mismatch of the transistors T4' and T5.

In the example, the control signal Vc2(n) is remained to be the voltage VDD to turn on the transistor T2 in the time period other than TP1-TP3 to control the scan signal Vo(n) to be equal to the voltage VSS, which prevents the scan signal Vo(n) from being disturbed by noise and the scan driver of the shift register of the example from having an error scan operation. However, the transistor T2, as turned on for a long time, may increase its threshold voltage to generate a malfunction due to a stress effect. The transistor T3 in the example can decrease the level of the scan signal Vo(n) to the voltage VSS as the transistor T2 has a malfunction so as to prevent from generating a wrong level of the scan signal Vo(n).

A level controller is disposed in the shift register of the example, which can provide an inverse-phased control signal in response to a control signal through charging and discharging of a capacitor and function of timing signals. Therefore, the level controller and shift register of the example can effectively resolve the disadvantages that the transistors of the level controller are easily damaged due to circuit mismatch, the conventional shift register easily has malfunction and the LCD has short lifetime, and has the advantages that the transistors are matched in size and are not easily damaged, the shift register unit has fewer chances to generate malfunction and the LCD has longer lifetime and better frame quality.

Example Two

Figure 5:
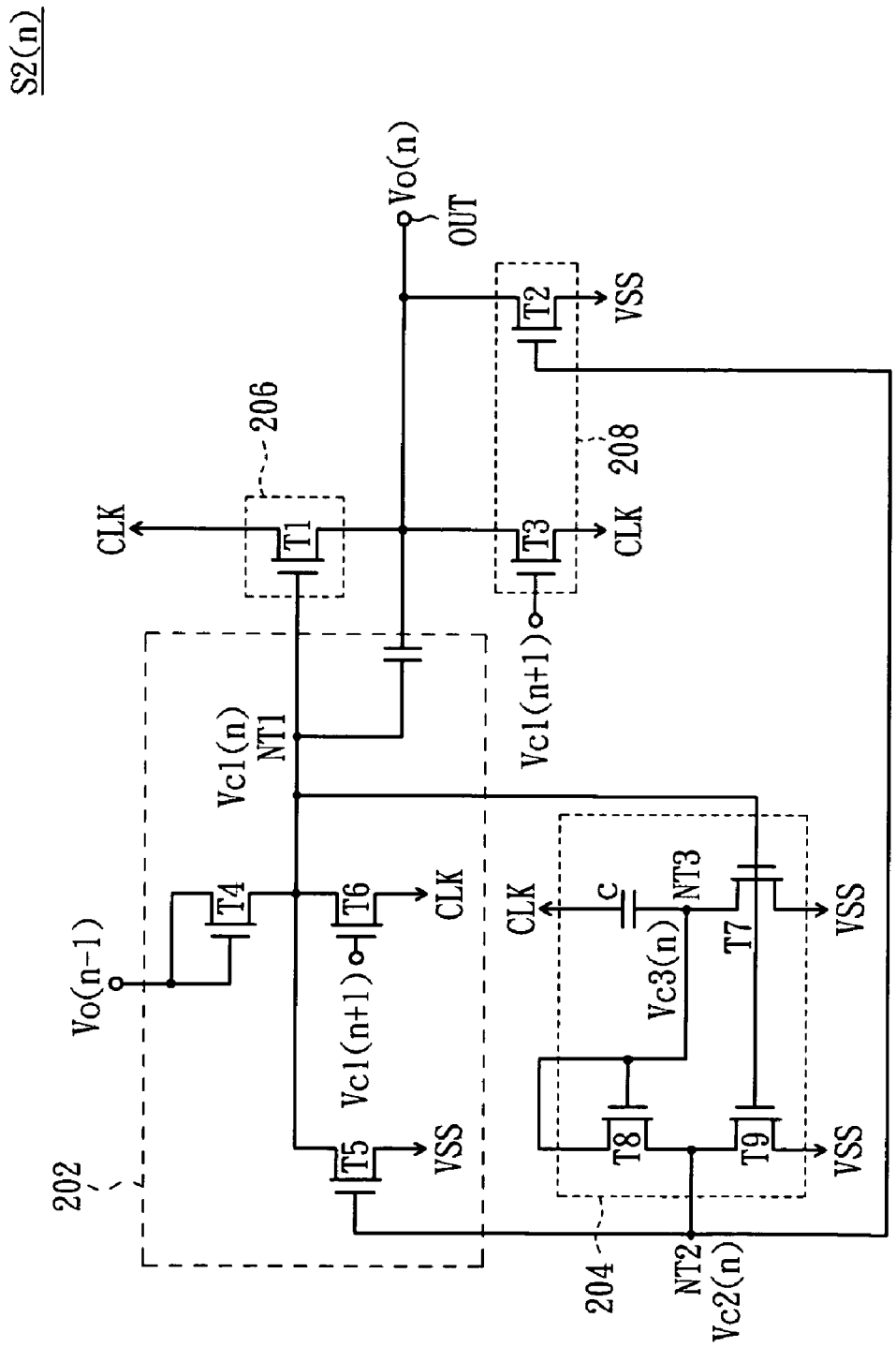
FIG. 5 is a detailed circuit diagram of the shift register unit in FIG. 2 according to a second example of the first embodiment.

Referring to FIG. 5, a detailed circuit diagram of the shift register unit in FIG. 2 according to a second example of the invention is shown. The difference between the shift register unit S2(n) of the example and the shift register unit S1(n) of the first example is that the gate and drain of the transistor T8 in the example are coupled to each other for receiving the control signal Vc3(n), and the highest and lowest levels of the timing signal CLK are the voltages VDD and VSS, respectively. Therefore, the transistor T8 of the example can have a similar operation to the corresponding transistor of the shift register unit S1(n) in the first example, in which the transistor T8 is turned on to equalize the control signal Vc2(n) with the voltage VDD in response to the high level of the control signal Vc3(n) and turned off in response to the low level of the control signal Vc3(n).

Consequently, the level controller 204 of the example substantially has the advantages that the transistors are matched in size and not easily damaged, the shift register unit has fewer chances to have malfunction and the LCD has longer lifetime and better frame quality.

Embodiment Two

Figure 6:
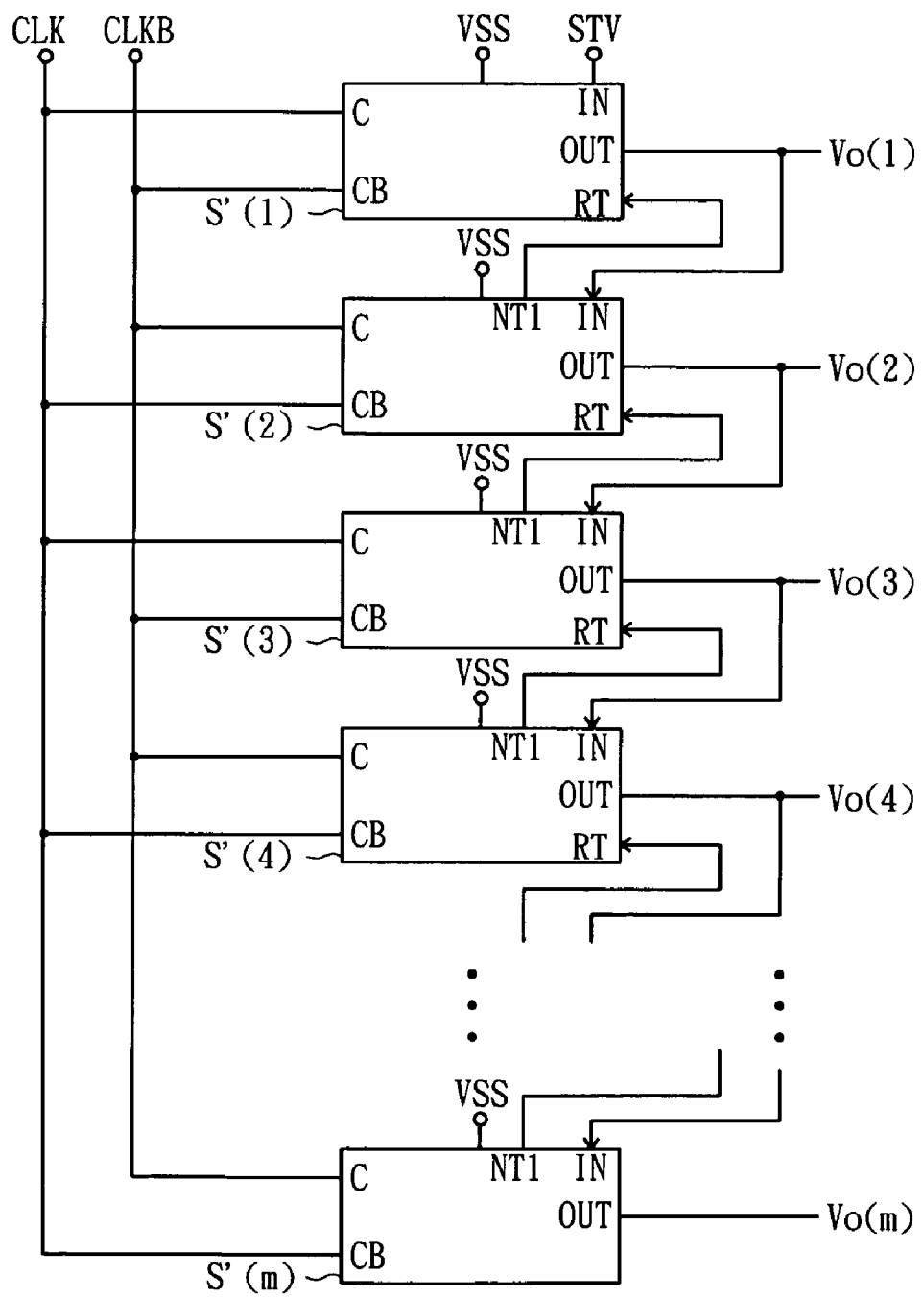
FIG. 6 is a block diagram of a shift register according to a second embodiment of the invention.

Referring to FIG. 6, a block diagram of a shift register according to a second embodiment of the invention is shown. The difference between the shift register 20 of the embodiment and the shift register 10 of the first embodiment is that each of the shift register units S'(1)-S'(m) further includes a time terminal CB for receiving an inverse clock signal compared to the clock signal received by the corresponding time terminal C.

In the shift register units S'(1)-S'(m), the timing signals received by any two adjacent timing terminals C have staggered enabling time, the timing signals received by any two adjacent timing terminals CB have staggered enabling time. The timing signals received respectively by the timing terminal CB of the n-th stage of shift register unit S'(n) and the timing terminal C of the (n+1)-th stage of shift register unit S'(n+1) have also staggered enabling time, wherein n is a natural number. In the following description, the n-th stage of shift register unit S'(n) is exemplified for illustrating a number of examples for implementing the shift register unit.

Example One

Figure 7:
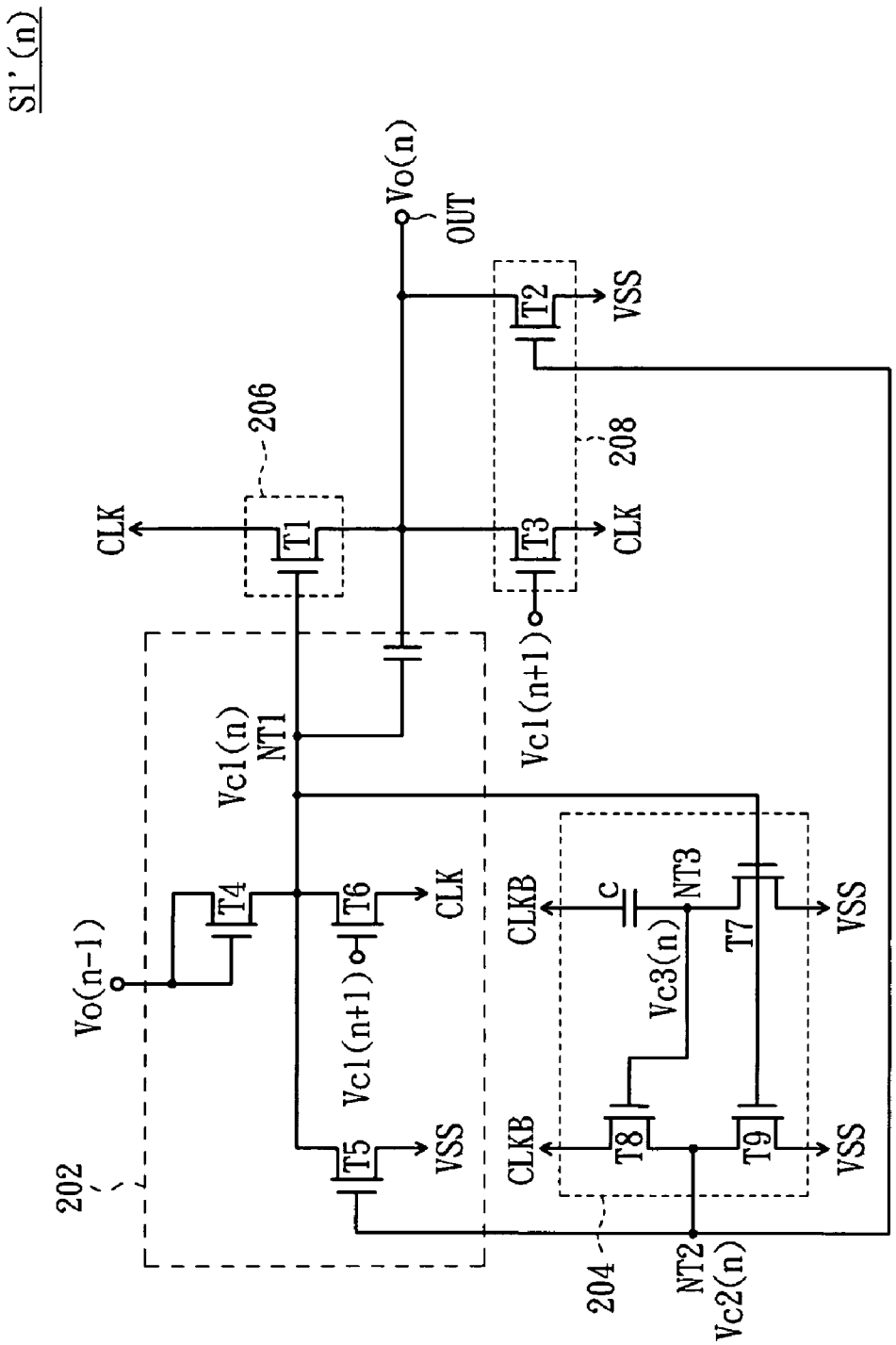
FIG. 7 is a detailed circuit diagram of the shift register unit in FIG. 6 according to a first example of the second embodiment.

Referring to FIG. 7, a detailed circuit diagram of the shift register unit in FIG. 6 according to a first example of the second embodiment is shown. The difference between the shift register unit S1'(n) of the example and the shift register unit S1(n) is that the capacitor C and the drain of the transistor T8 in the second example receive the timing signal CLKB. Owing that the timing signal CLKB is substantially inverse in phase to the timing signal CLK, that is, the phase of the timing signal CLKB substantially falls behind the phase of the timing signal CLK by 180 degrees. Therefore, the waveforms of the control signals Vc3(n) and Vc2(n) in the example are delayed by half a period as compared to the waveforms of the corresponding control signals in the first example.

Consequently, the level controller 204 of the example substantially has the advantages that the transistors are matched in size and not easily damaged, the shift register unit has fewer chances to have malfunction and the LCD has longer lifetime and better frame quality.

Example Two

Figure 8:
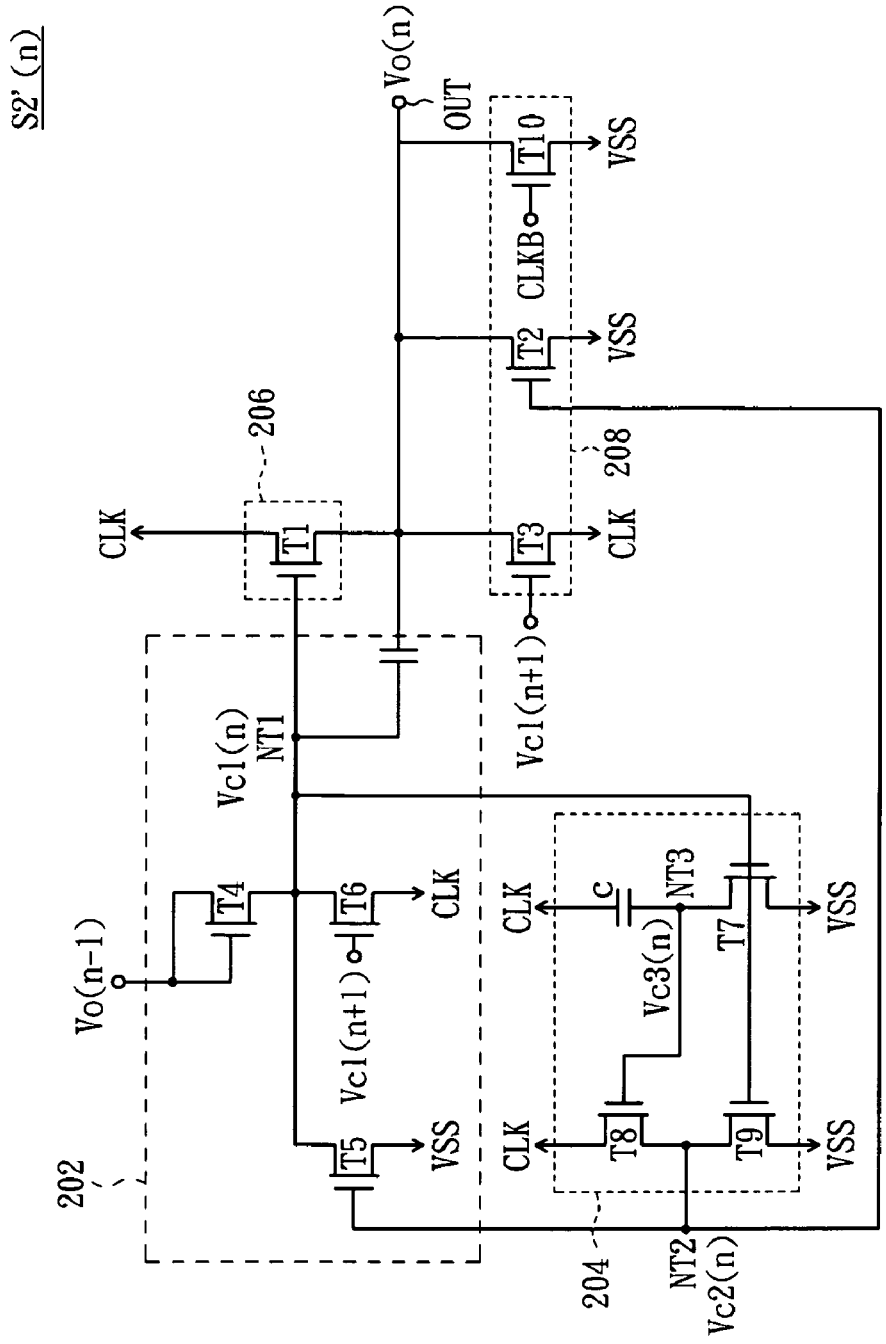
FIG. 8 is a detailed circuit diagram of the shift register unit in FIG. 6 according to a second example of the second embodiment.

Referring to FIG. 8, a detailed circuit diagram of the shift register unit in FIG. 6 according to a second example of the second embodiment is shown. The difference between the shift register unit S2'(n) of the example and the shift register unit S1(n) is that the level lowering unit 208 of the example further includes a transistor T10, and the transistor T10 has a gate for receiving the timing signal CLKB, a drain coupled to the output terminal OUT and a source for receiving the voltage VSS. In the time periods TP1 and TP3, the transistor T10 is turned on such that the scan signal Vo(n) is equal to the voltage VSS. Therefore, the level lowering unit 208 of the example can lower down the level of the scan signal Vo(n) via the transistor T10 in the periods TP1 and TP3 to ensure that the scan signal Vo(n) maintains at the low level in the periods TP1 and TP2 and prevent the scan signal Vo(n) from increasing to a high level due to influence of circuit noise. Consequently, in addition that the shift register unit S2'(n) of the example substantially has the advantages that the transistors are matched in size and not easily damaged, the shift register unit has fewer chances to have malfunction and the LCD has longer lifetime and better frame quality, the shift register unit S2'(n) can reduce the opportunity that the scan signal Vo(n) has wrong levels due to influence of circuit noise.

Example Three

Figure 9:
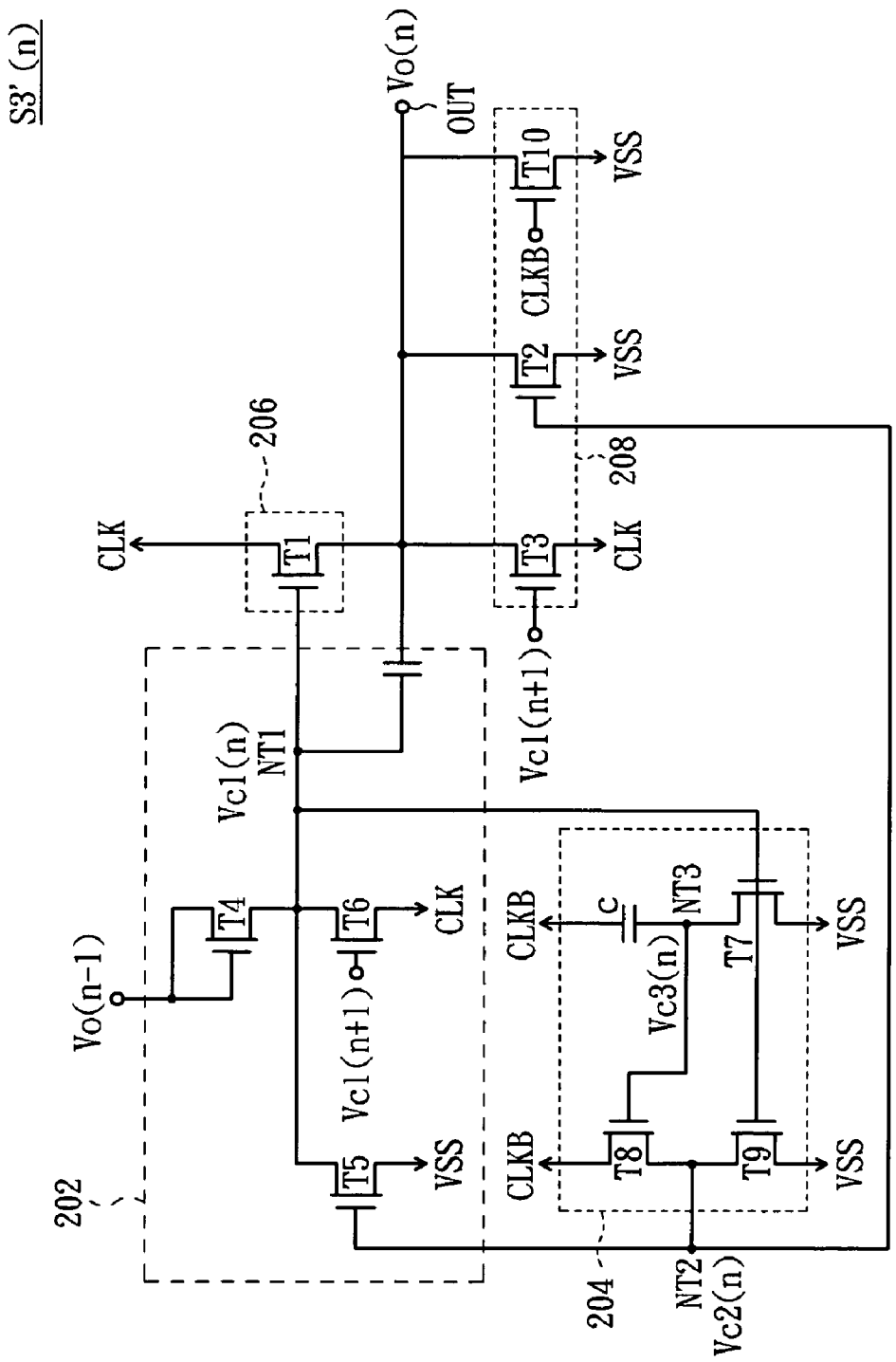
FIG. 9 is a detailed circuit diagram of the shift register unit in FIG. 6 according to a third example of the second embodiment.

Referring to FIG. 9, a detailed circuit diagram of the shift register unit in FIG. 6 according to a third example of the second embodiment is shown. The shift register unit S3'(n) of the example is a derivative circuit of the shift register unit S2'(n) of the second example. The difference between the shift register unit S3'(n) of the example and the shift register unit S2'(n) of the second example is that the capacitor C and the drain of the transistor T8 in the example receive the timing signal CLKB instead of the timing signal CLK. Therefore, the operation of the shift register unit S3'(n) in the example can be reasoned according to that of the second example by analog.

Example Four

Figure 10:
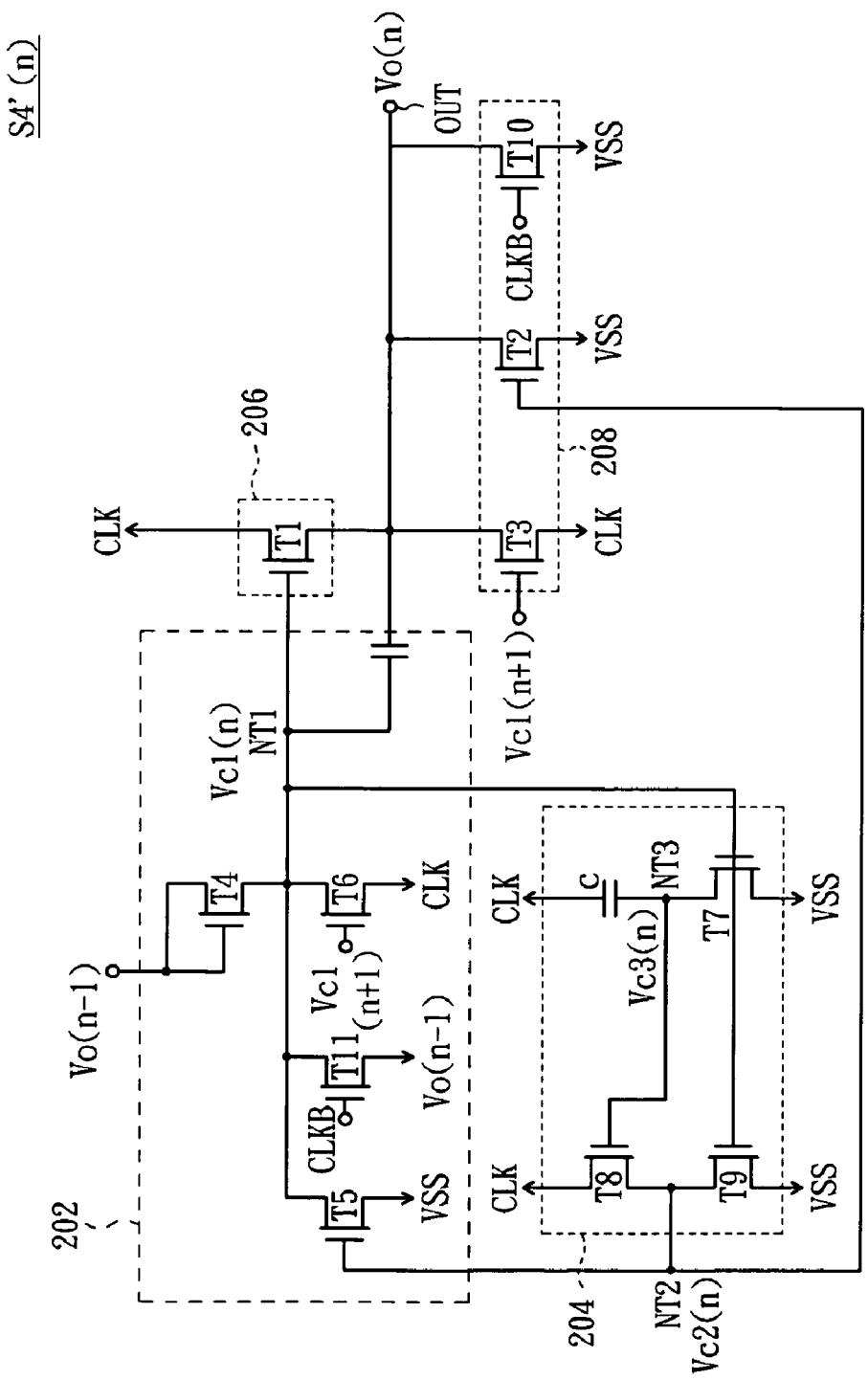
FIG. 10 is a detailed circuit diagram of the shift register unit in FIG. 6 according to a fourth example of the second embodiment.

Referring to FIG. 10, a detailed circuit diagram of the shift register unit in FIG. 6 according to a fourth example of the second embodiment is shown. The difference between the shift register unit S4'(n) of the example and the shift register unit S2'(n) of the second example is that the driving unit 202 of the example further includes a transistor T11, and the transistor T11 has a gate for receiving the timing signal CLKB, a drain coupled to the node NT1, and a source for receiving the scan signal Vo(n−1). In the time period TP3, the transistor T11 is turned on such that the scan signal Vc1(n) is equal to the voltage VSS. Therefore, the driving unit 202 of the example can have a similar operation to the corresponding driving unit in the second example, in which the control signal Vc1(n) is controlled to be the voltage VSS in the time period TP3.

Consequently, the level controller 204 of the example substantially has the advantages that the transistors are matched in size and not easily damaged, the shift register unit has fewer chances to have malfunction and the LCD has longer lifetime and better frame quality.

Example Fifth

Figure 11:
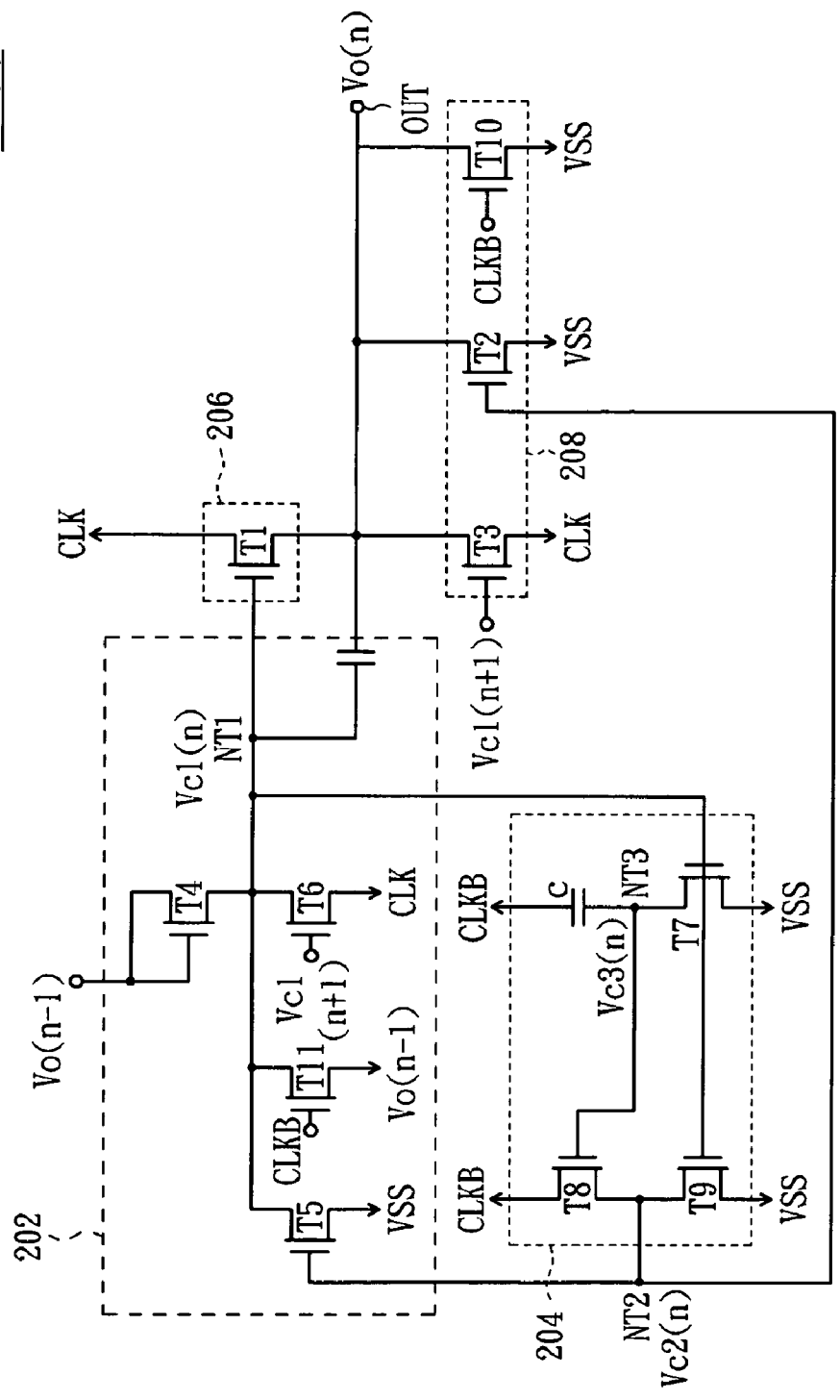
FIG. 11 is a detailed circuit diagram of the shift register unit in FIG. 6 according to a fifth example of the second embodiment.

Referring to FIG. 11, a detailed circuit diagram of the shift register unit in FIG. 6 according to a fifth example of the second embodiment is shown. The shift register unit S5'(n) of the example is a derivative circuit of the shift register unit S4'(n) of the fourth example. The difference between the shift register unit S5'(n) of the example and the shift register unit S4'(n) of the fourth example is that the capacitor C and the drain of the transistor T8 in the example receive the timing signal CLKB instead of the timing signal CLK. Therefore, the operation of the shift register unit S5'(n) in the example can be reasoned according to that of the second example by analog.

Example Sixth

Figure 12:
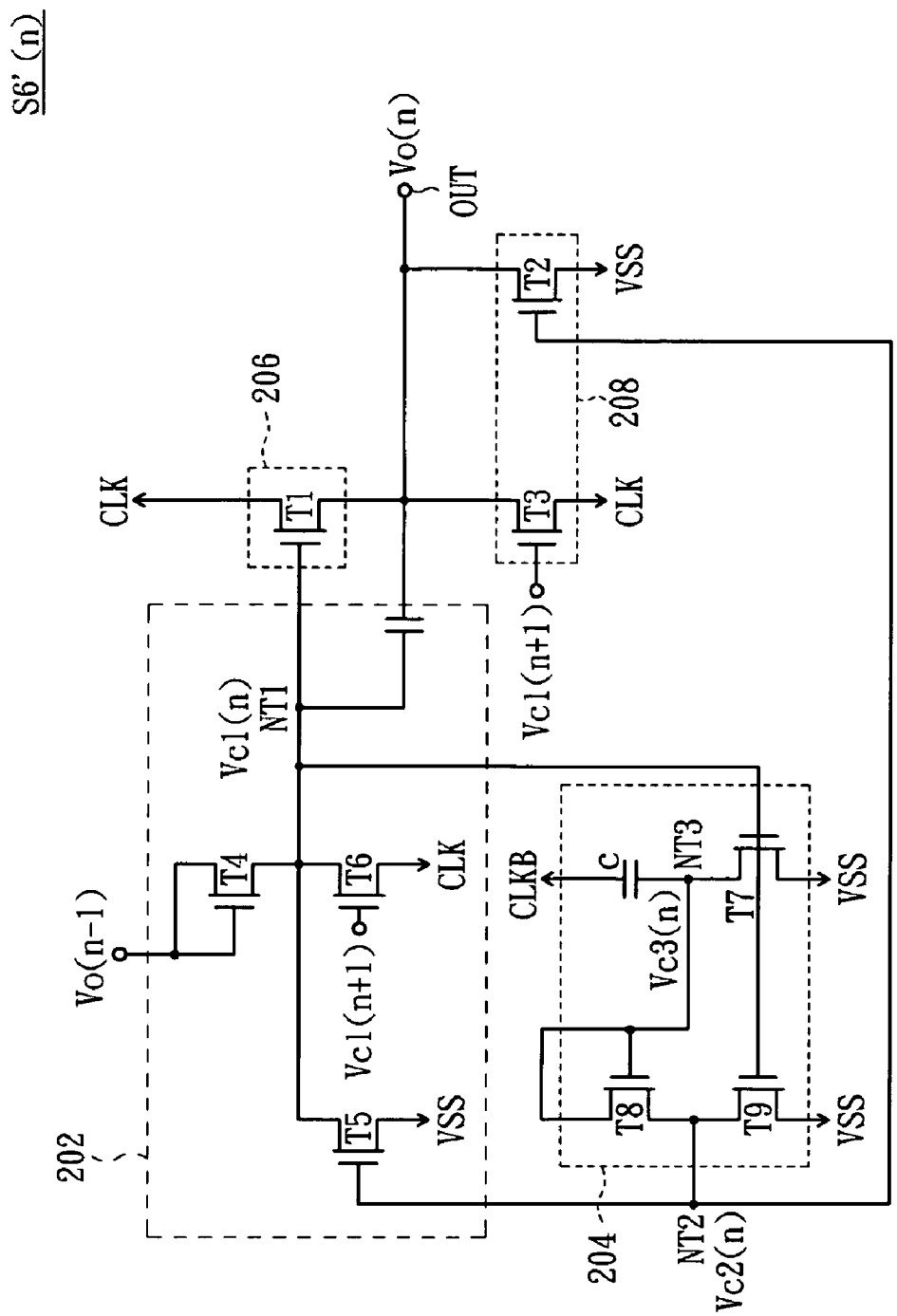
FIG. 12 is a detailed circuit diagram of the shift register unit in FIG. 6 according to a sixth example of the second embodiment.

Referring to FIG. 12, a detailed circuit diagram of the shift register unit in FIG. 6 according to a sixth example of the second embodiment is shown. The difference between the shift register unit S6'(n) of the example and the shift register unit S1'(n) of the first example is that the gate and drain of the transistor T8 in the example are coupled to each other for receiving the control signal Vc3(n), and the highest and lowest levels of the timing signal CLKB are the voltages VDD and VSS, respectively. Therefore, the transistor T8 of the example can have a similar operation to the corresponding transistor of the shift register unit S1'(n) in the first example according to the same reason as in the first example.

Consequently, the level controller 204 of the example substantially has the advantages that the transistors are matched in size and not easily damaged, the shift register unit has fewer chances to have malfunction and the LCD has longer lifetime and better frame quality.

Example Seventh

Figure 13:
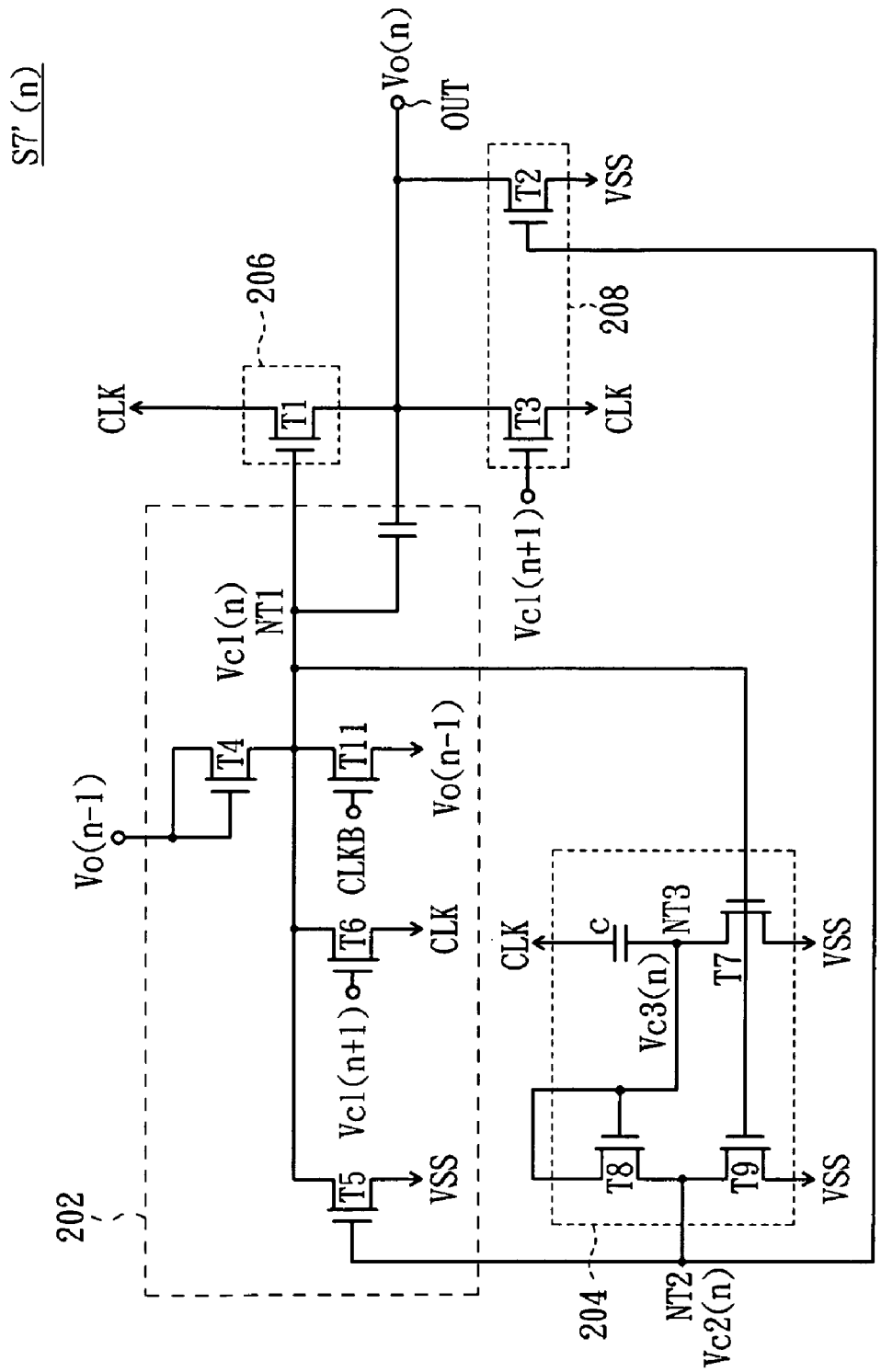
FIG. 13 is a detailed circuit diagram of the shift register unit in FIG. 6 according to a seventh example of the second embodiment.

Referring to FIG. 13, a detailed circuit diagram of the shift register unit in FIG. 6 according to a seventh example of the second embodiment is shown. The difference between the shift register unit S7'(n) of the example and the shift register unit S2(n) is that the driving unit 202 of the example further includes a transistor T11. The transistor T11 is turned on in the time period TP3 such that the control signal Vc1(n) is equal to the voltage VSS. Therefore, the operation of the shift register unit S7'(n) can be reasoned according to that of the fourth example by analog.

Embodiment Three

Figure 14:
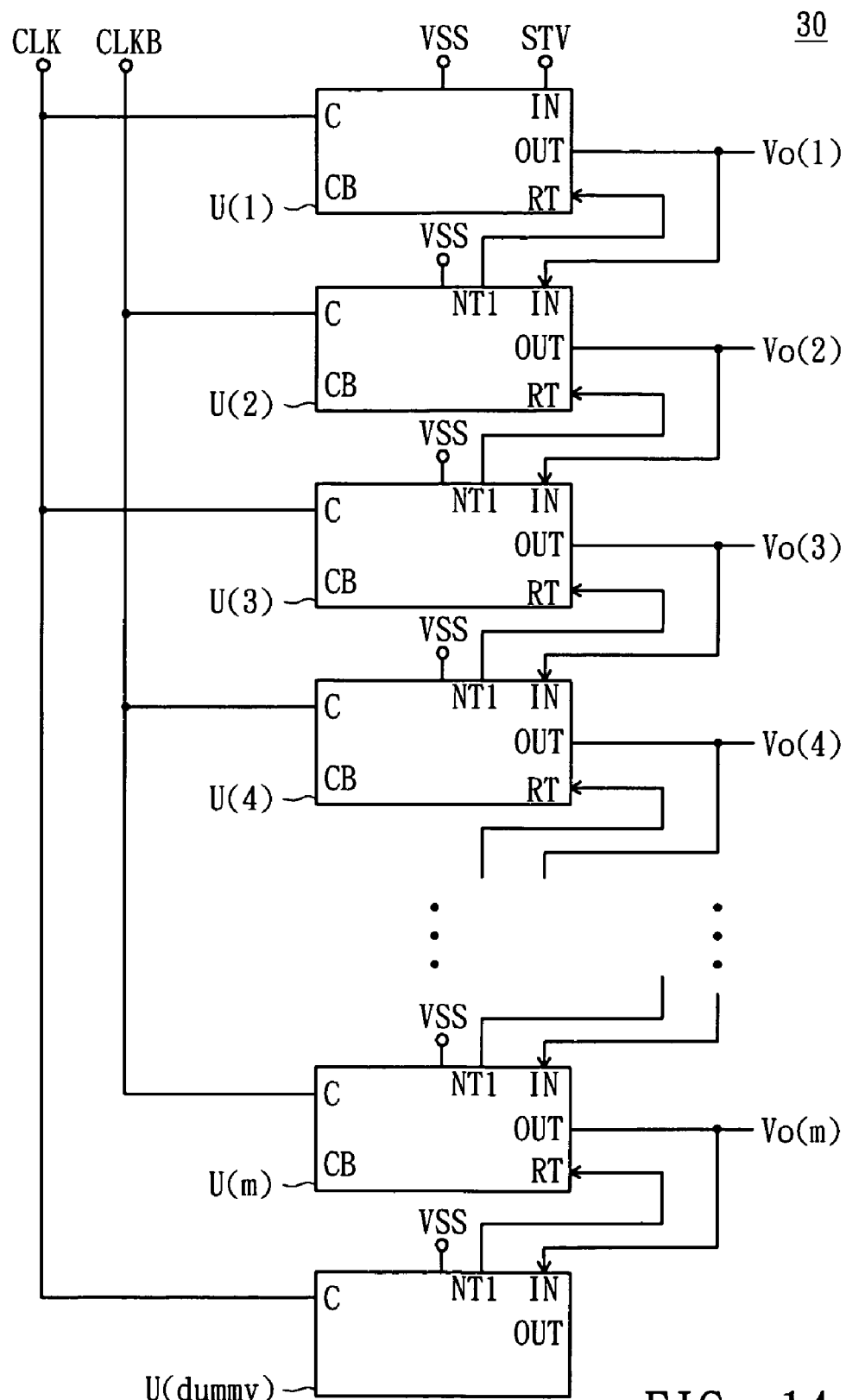
FIG. 14 is a block diagram of a shift register according to a third embodiment of the invention.
Figure 15:
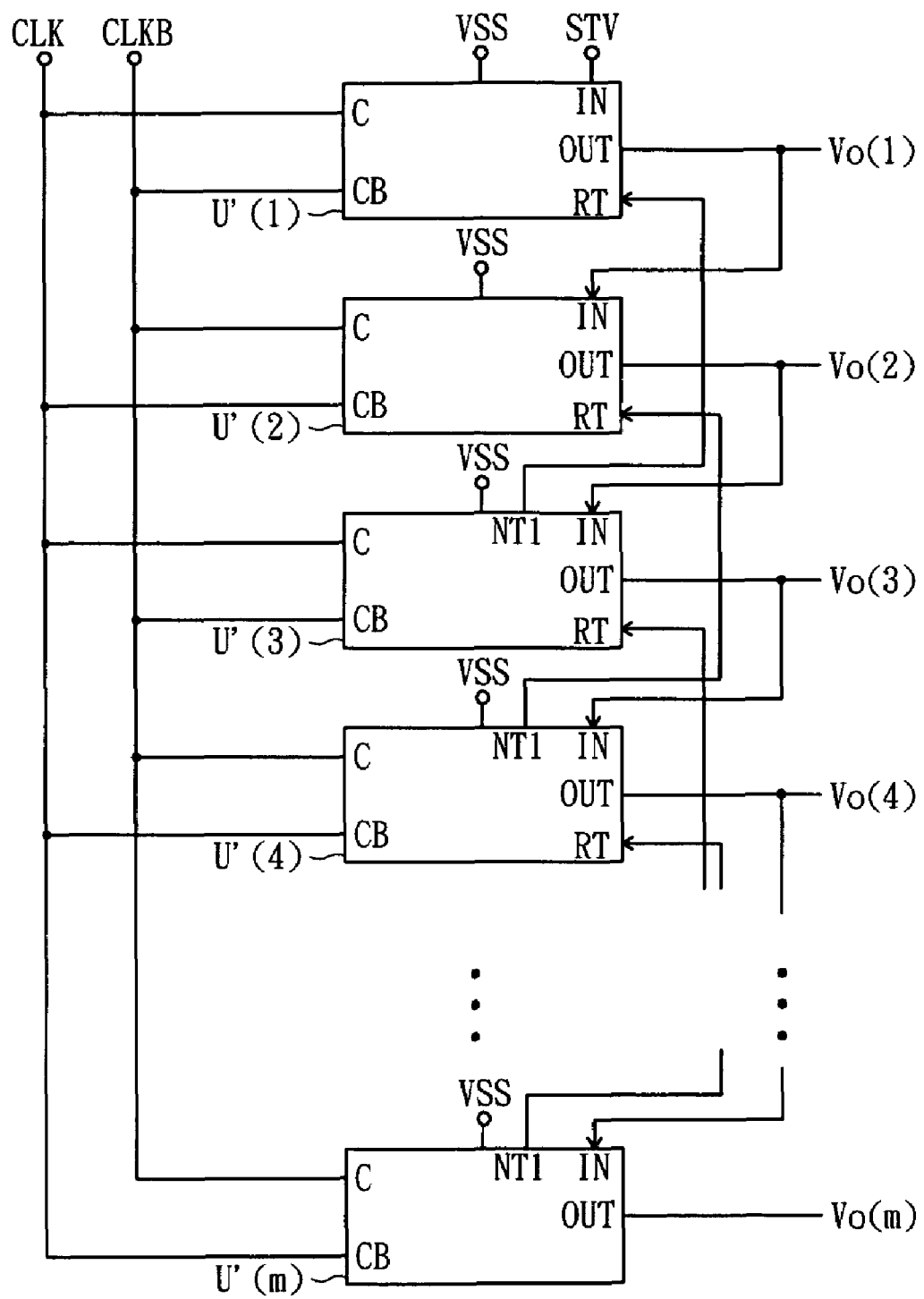
FIG. 15 is another block diagram of the shift register according to the third embodiment of the invention.

Referring to FIGS. 14 and 15, FIG. 14 shows a block diagram of a shift register according to a third embodiment of the invention, and FIG. 15 shows another block diagram of the shift register according to the third embodiment of the invention. The difference between the shift register 30 of the embodiment and the shift register 10 of the first embodiment is that the control terminals RT of the shift register units U(1)-U(m−2) in the embodiment respectively receive the voltage signals of the shift register units U(3)-U(m) at the nodes NT1 to be the control signals Vc1(1)-Vc1(m−2). The difference between the shift register 30' of the embodiment and the shift register 20 of the second embodiment is that the control terminals RT of the shift register units U'(1)-U'(m−2) in the embodiment respectively receive the voltage signals of the shift register units U'(3)-U'(m) at the nodes NT1 to be the control signals Vc1(1)-Vc1(m−2). In the following description, the n-th stage of shift register unit U(n) and U'(n) are exemplified for illustrating a number of examples for implementing the shift register unit.

Example One

Figure 16:
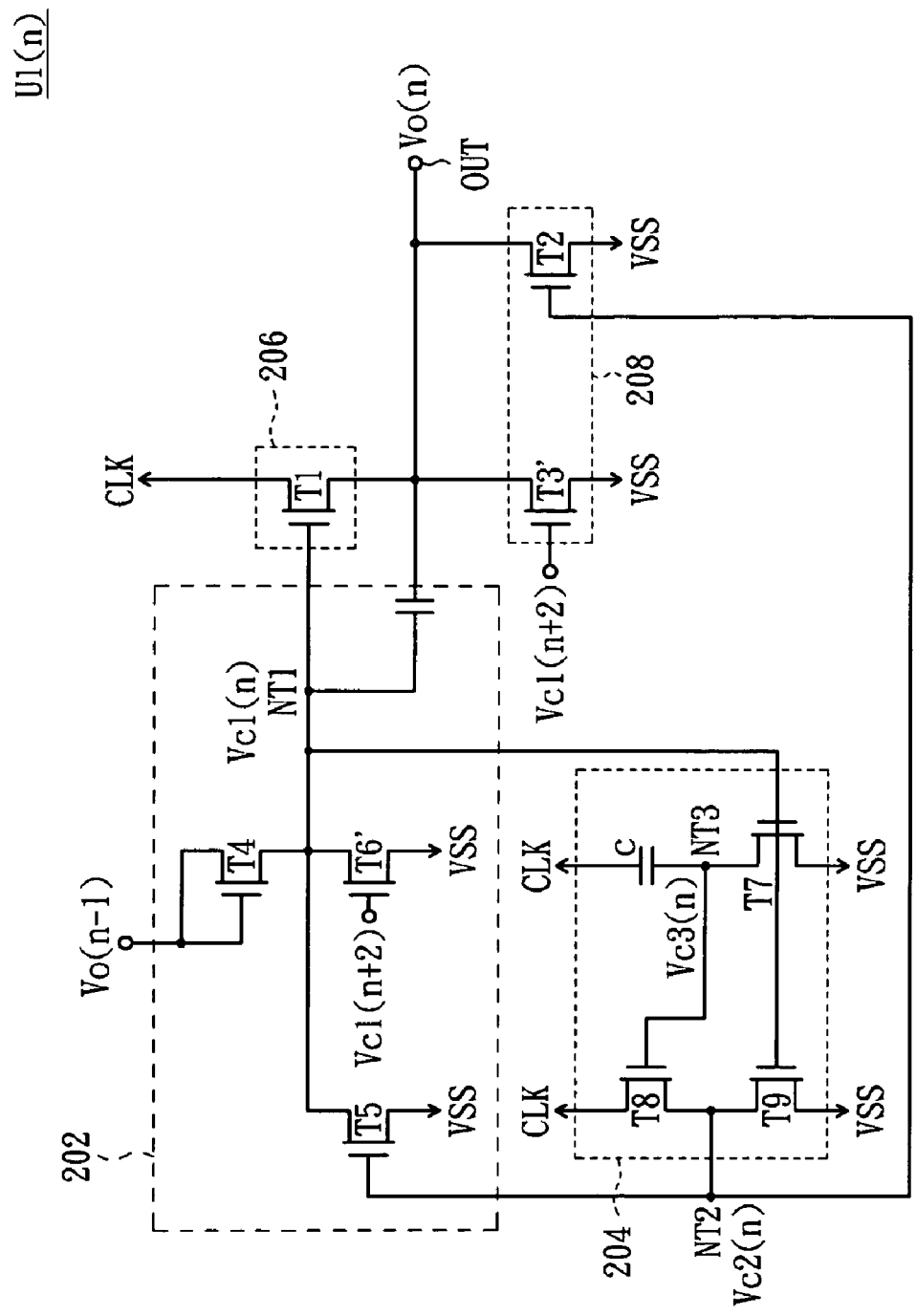
FIG. 16 is a detailed circuit diagram of the shift register unit in FIG. 14 according to the first example of the third embodiment.
Figure 17:
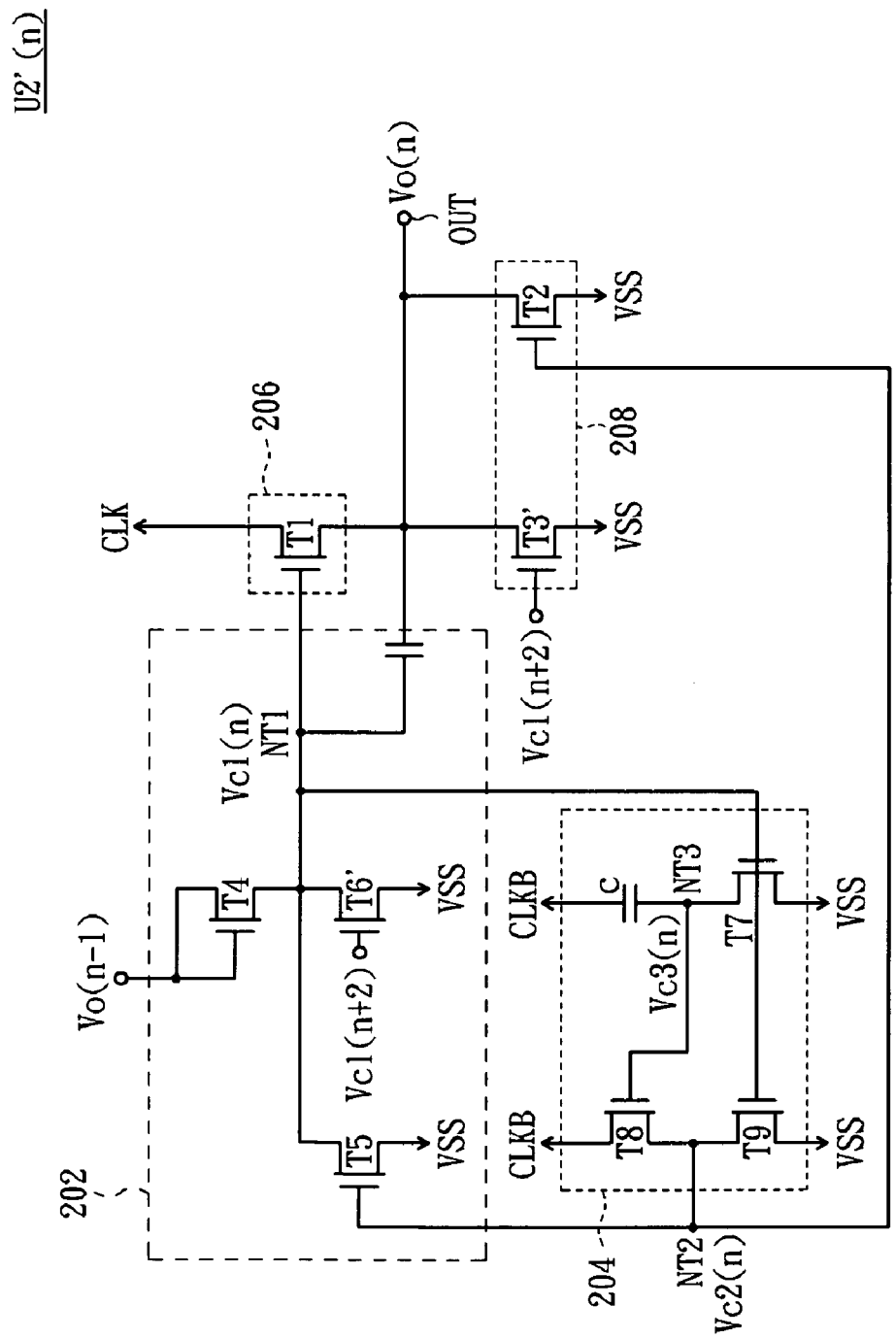
FIG. 17 is a detailed circuit diagram of the shift register unit in FIG. 15 according to the second example of the third embodiment.
Figure 18:
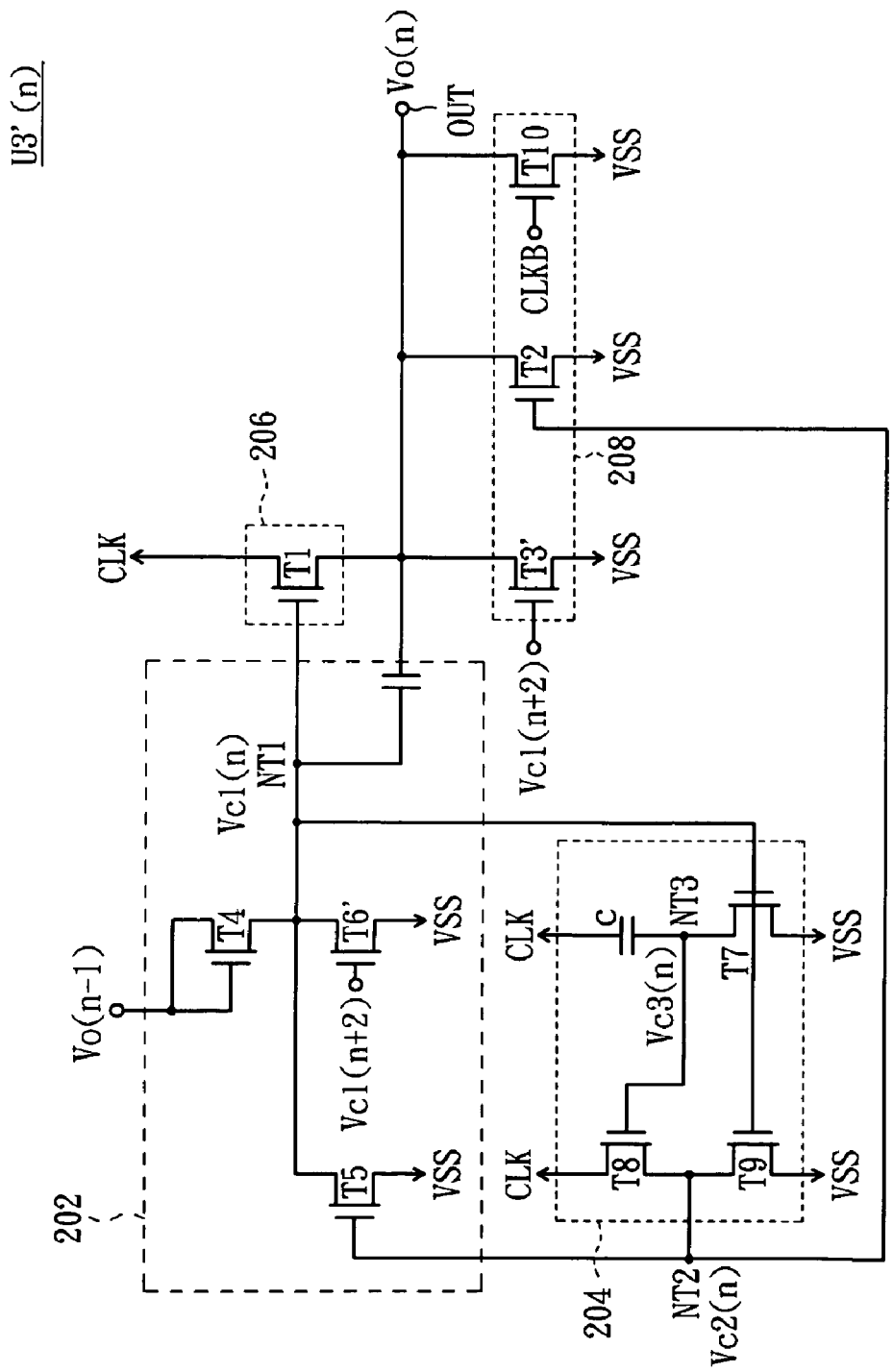
FIG. 18 is a detailed circuit diagram of the shift register unit in FIG. 15 according to the third example of the third embodiment.
Figure 19:
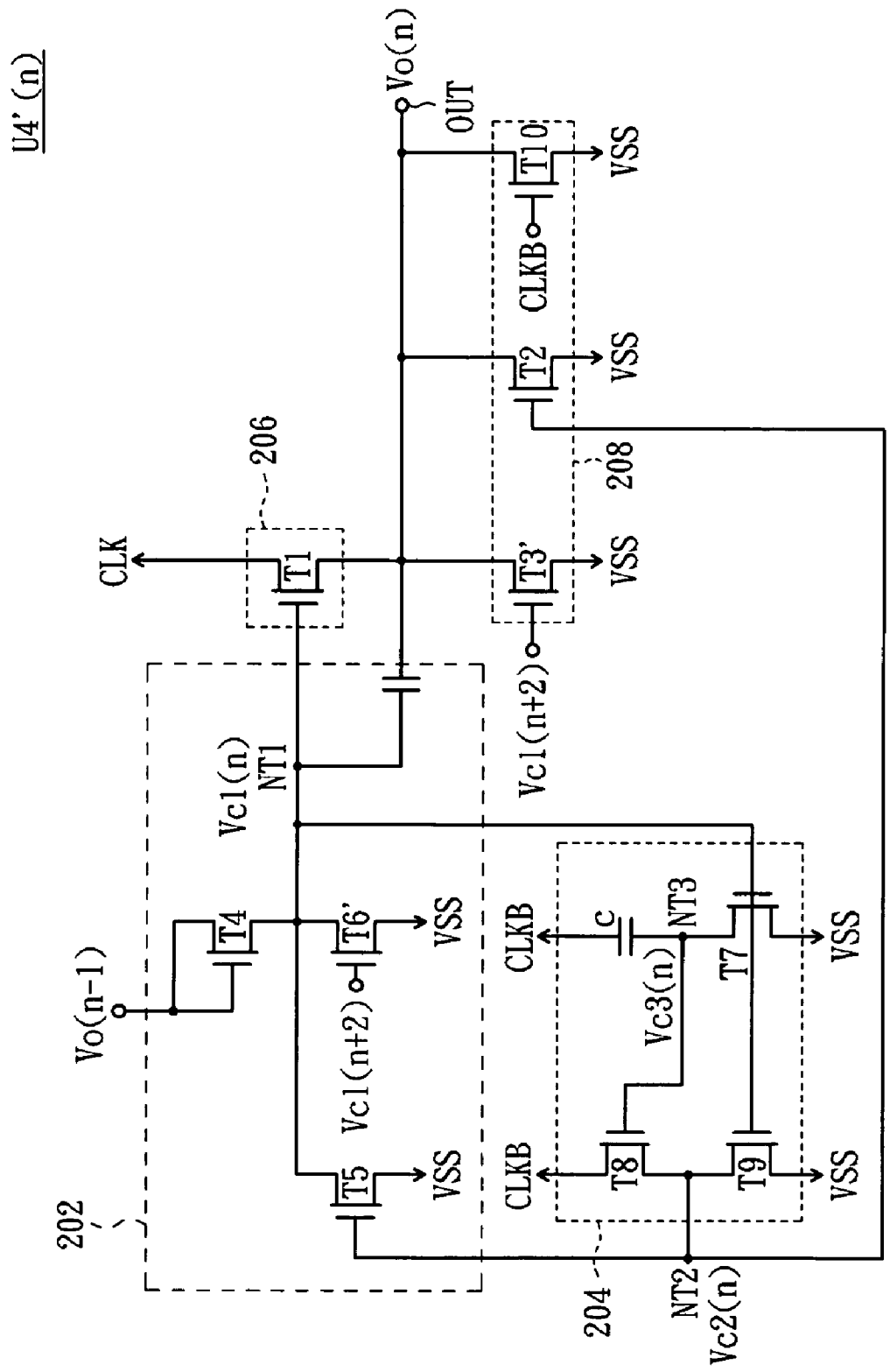
FIG. 19 is a detailed circuit diagram of the shift register unit in FIG. 15 according to the fourth example of the third embodiment.
Figure 20:
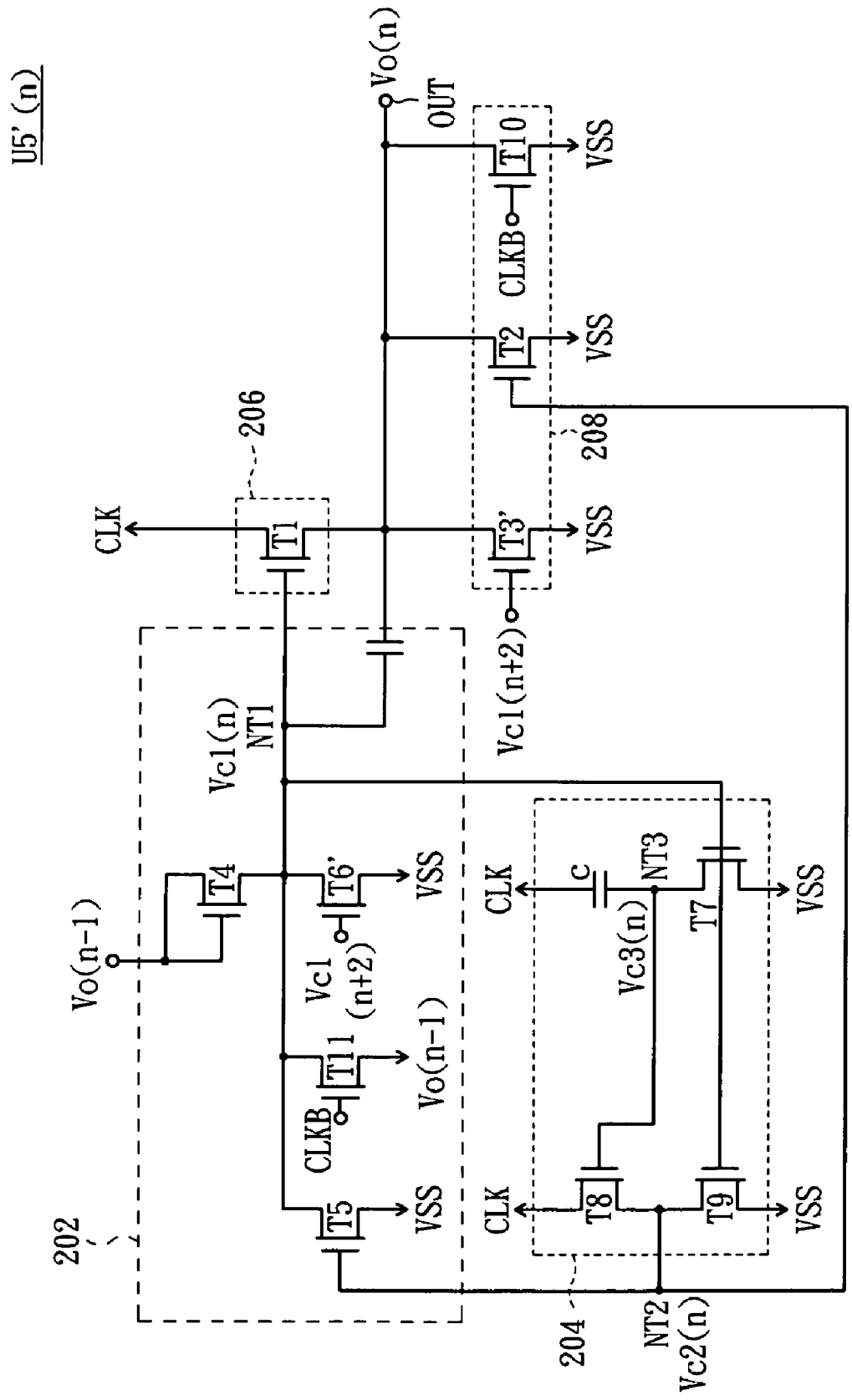
FIG. 20 is a detailed circuit diagram of the shift register unit in FIG. 15 according to the fifth example of the third embodiment.
Figure 21:
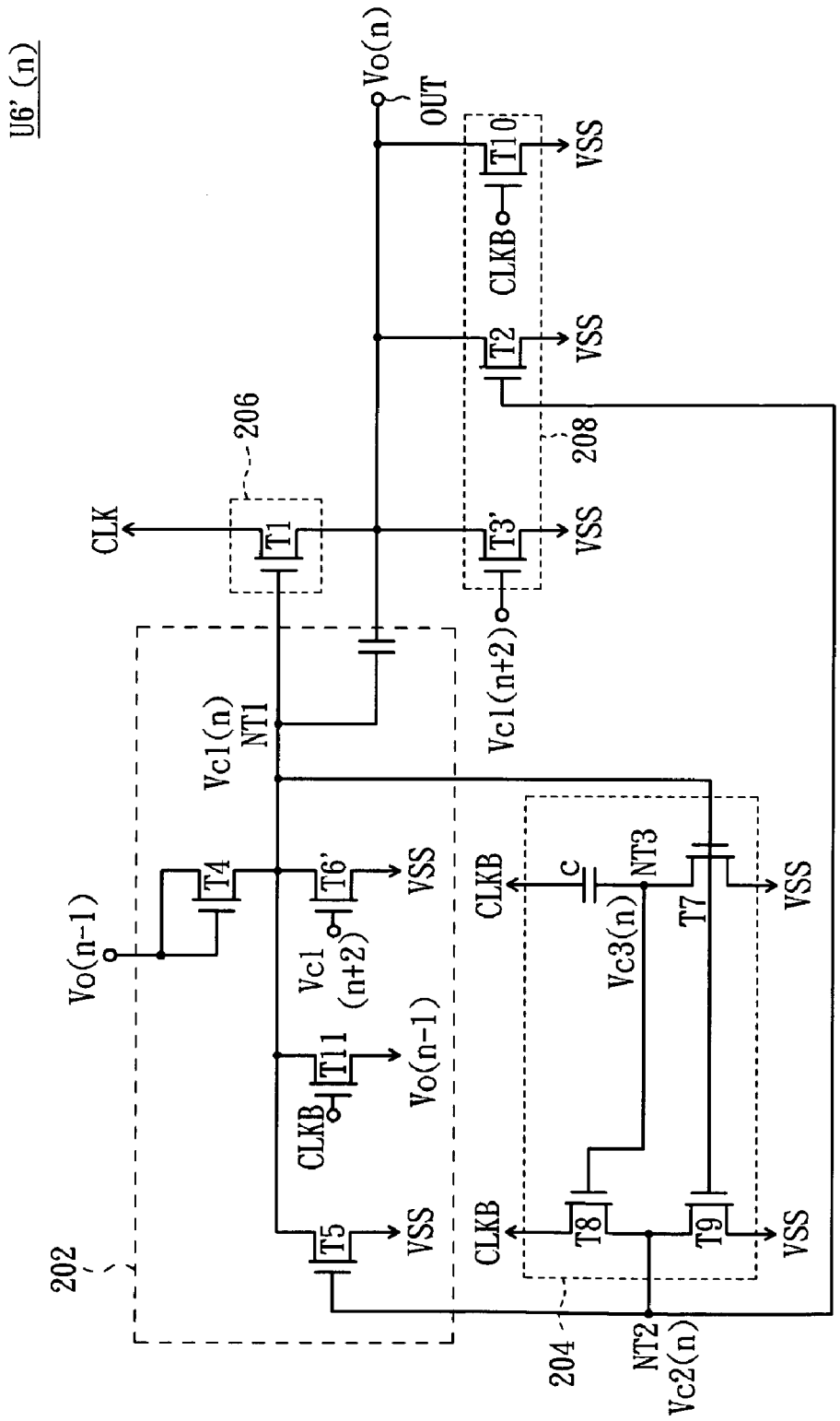
FIG. 21 is a detailed circuit diagram of the shift register unit in FIG. 15 according to the sixth example of the third embodiment.

Referring to FIG. 16, a detailed circuit diagram of the shift register unit in FIG. 14 according to a first example of the third embodiment is shown. The difference between the shift register unit U1(n) of the first example in the third embodiment and the shift register unit S1(n) of the first example in the first embodiment is that the shift register unit U1(n) includes transistors T3' and T6' instead of the transistors T3 and T6.

The transistors T3' and T6' have drains respectively coupled to the node NT1 and the output terminal OUT, gates for receiving the control signal Vc1(n+2) of the (n+2)-th stage of shift register unit U(n+2), and sources for receiving the voltage VSS. Therefore, according to the signal waveform diagram of FIG. 4A, it can be seen that the transistors T3' and T6' are turned on in the time periods TP3 and TP4 such that the control signal Vc1(n) and the scan signal Vo(n) are equal to the voltage VSS. The shift register unit U(n) has a substantially similar operation to the shift register unit S1(n) in the first example of the first embodiment and can control the control signal Vc1(n) and the scan signal Vo(n) to be equal to the voltage VSS in the time period TP4. Consequently, the level controller 204 of the example substantially has the advantages that the transistors are matched in size and not easily damaged, the shift register unit has fewer chances to have malfunction and the LCD has longer lifetime and better frame quality.

Examples Two to Six

Referring to FIGS. 17-21, detailed circuit diagrams of the shift register unit of FIG. 15 according to the second, the third, the fourth, the fifth and the sixth examples of the third embodiment are shown. The shift register units U2'(n), U3'(n), U4'(n), U5'(n) and U6'(n) are respectively the derivative circuits of the corresponding shift register units in the first to the fifth examples of the second embodiment, which replace the transistors T3 and T6 of the first embodiment by the transistors T3' and T6'. Therefore, the operations of the shift register units U2'(n), U3'(n), U4'(n), U5'(n) and U6'(n) can be reasoned according to those of the first embodiment by analog.

Example Seven

Figure 22:
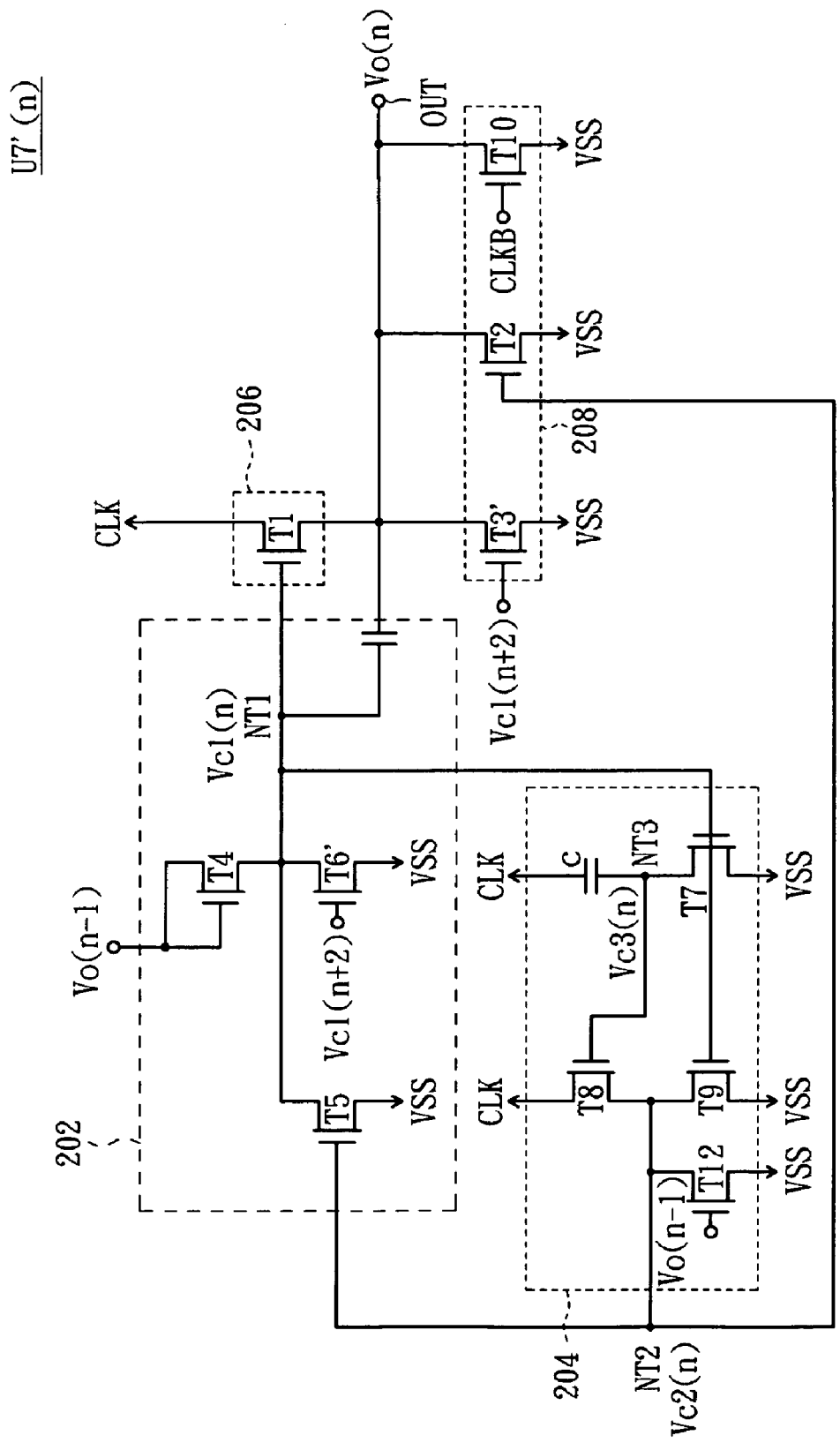
FIG. 22 is a detailed circuit diagram of the shift register unit in FIG. 15 according to the seventh example of the third embodiment.

Referring to FIG. 22, a detailed circuit diagram of the shift register unit in FIG. 15 according to a seventh example of the third embodiment is shown. The difference between the shift register unit U7'(n) of the example and the shift register unit U3'(n) of the third example is that the level controller 204 of the example further includes a transistor T12, and the transistor T12 has a drain coupled to the node NT2, a gate for receiving the scan signal Vo(n−1) of the (n−1)-th stage of shift register unit U7'(n−1), and a source for receiving the voltage VSS. In the time period TP1, the scan signal Vo(n−1) is controlled to be equal to the voltage VDD such that the transistor T12 is turned on to control the control signal Vc2(n) to be equal to the voltage VSS. Therefore, the level controller 204 of the example has a substantially similar operation to the corresponding level controller of the shift register unit S1(n) in the first example of the first embodiment, which can control the control signal Vc2(n) to be equal to the voltage VSS in the time period TP1. Consequently, the level controller 204 of the example substantially has the advantages that the transistors are matched in size and not easily damaged, the shift register unit has fewer chances to have malfunction and the LCD has longer lifetime and better frame quality.

Examples Eight to Ten

Figure 23:
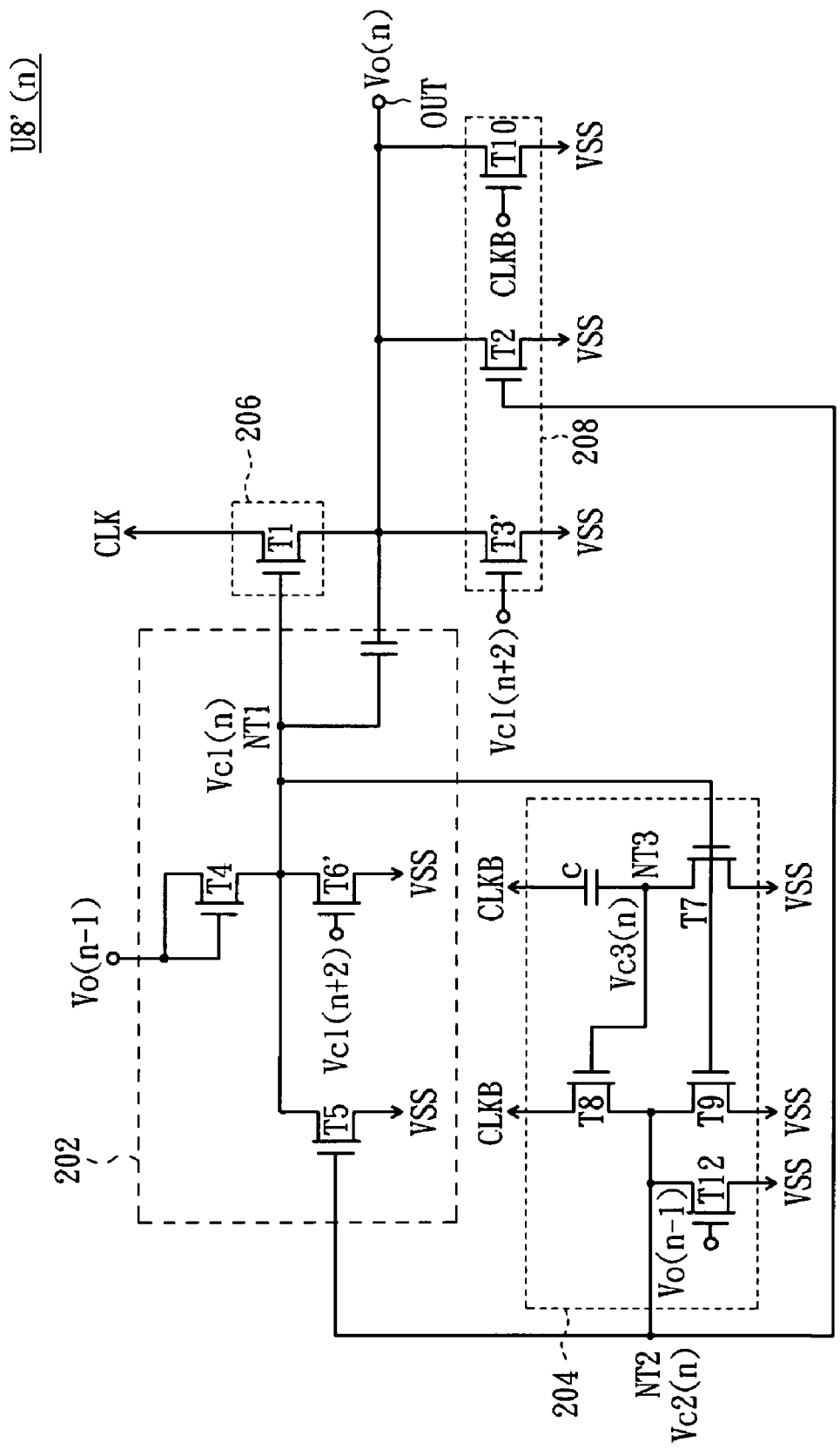
FIG. 23 is a detailed circuit diagram of the shift register unit in FIG. 15 according to the eighth example of the third embodiment.
Figure 24:
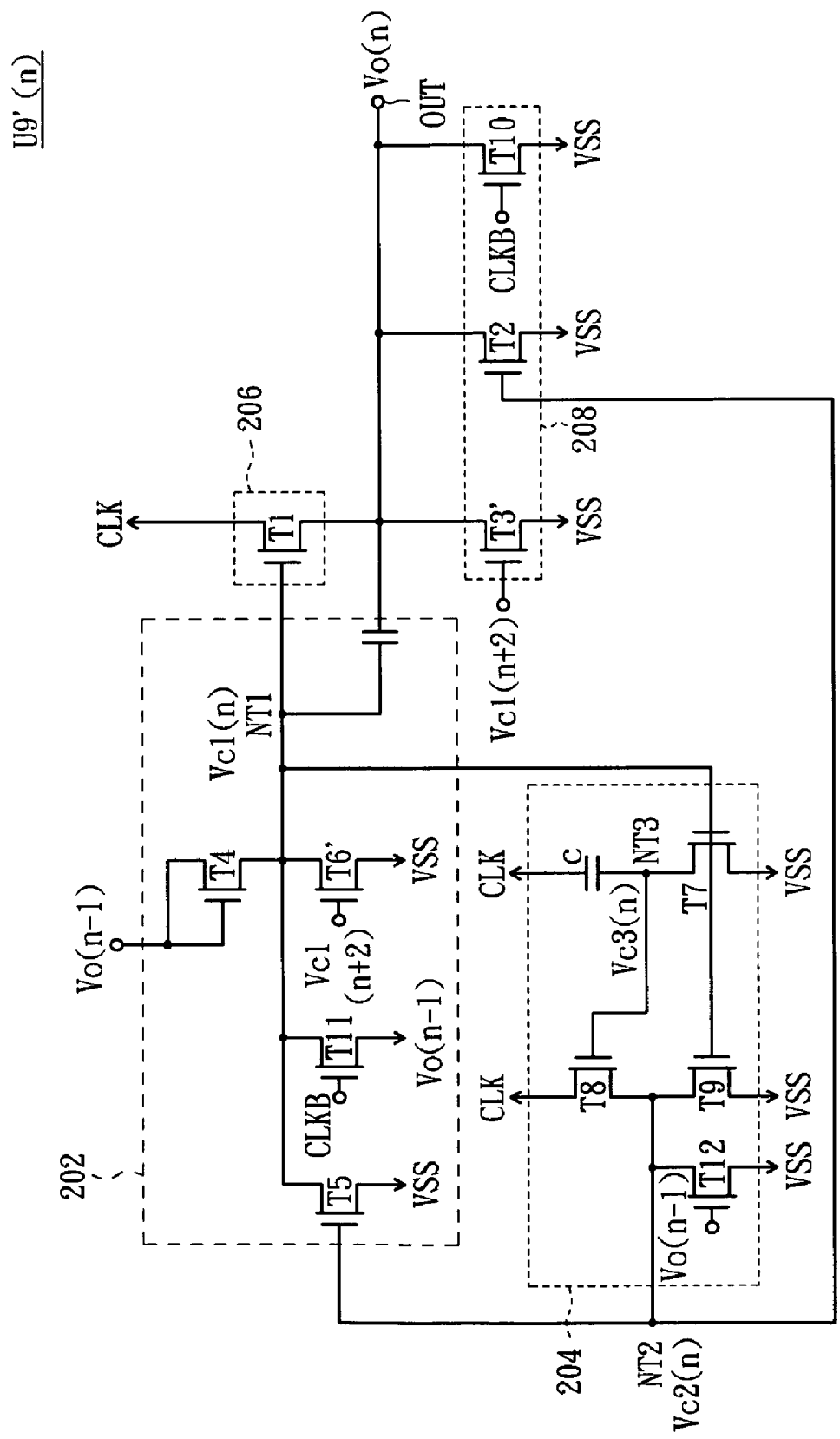
FIG. 24 is a detailed circuit diagram of the shift register unit in FIG. 15 according to the ninth example of the third embodiment.
Figure 25:
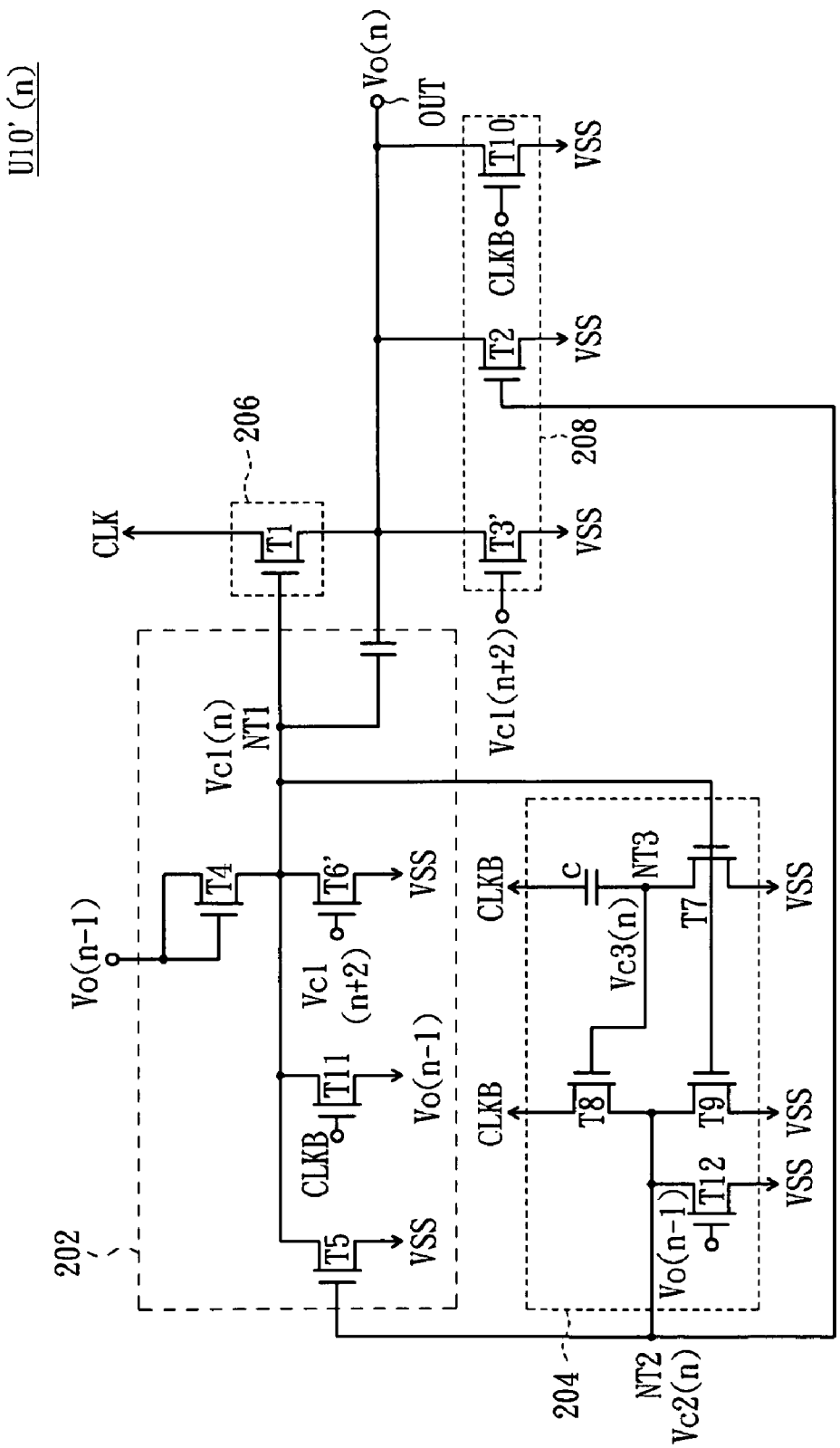
FIG. 25 is a detailed circuit diagram of the shift register unit in FIG. 15 according to the tenth example of the third embodiment.
Figure 26:
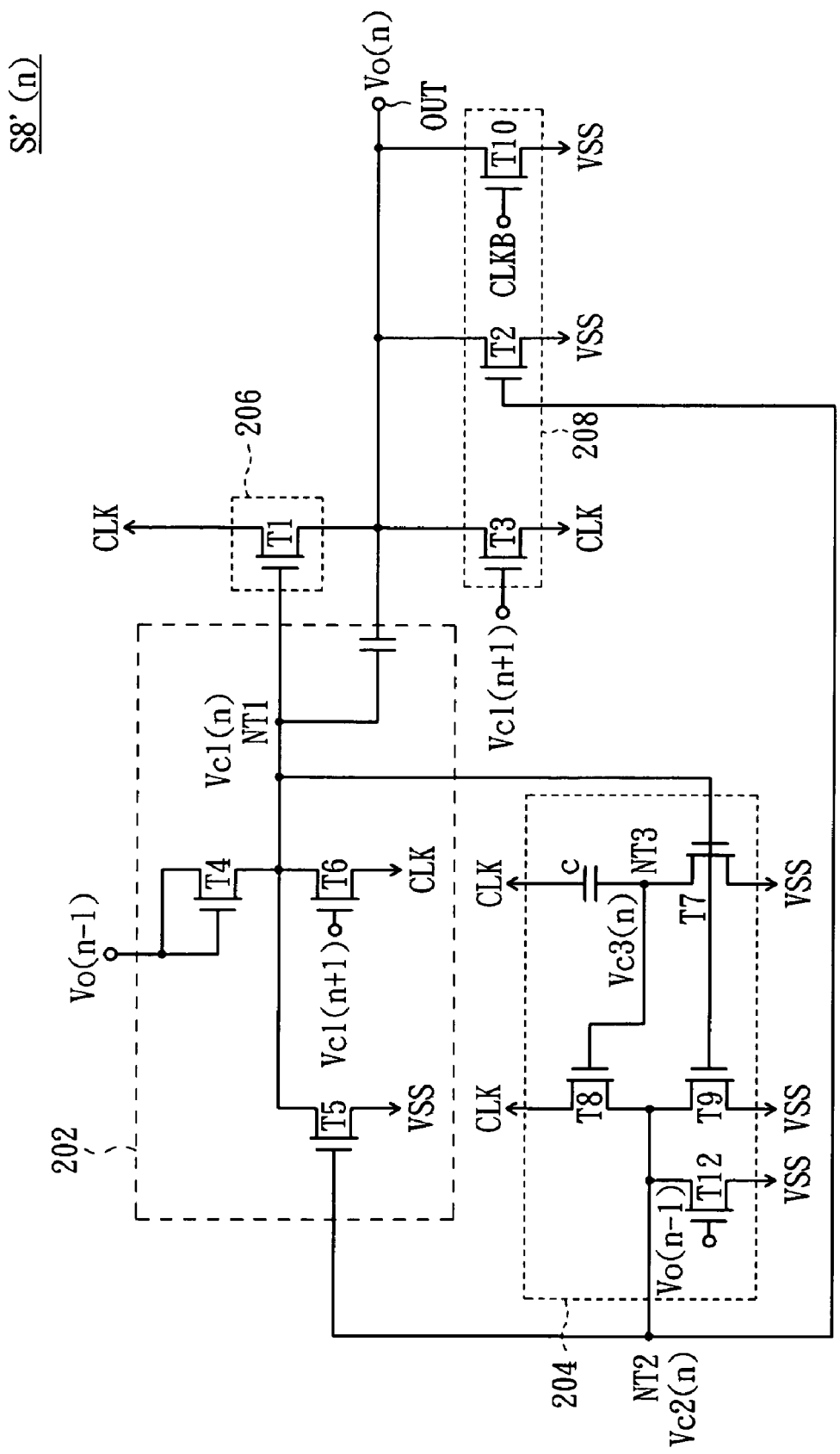
FIG. 26 is a detailed circuit diagram of the shift register unit in FIG. 6 according to the eighth example of the second embodiment.
Figure 27:
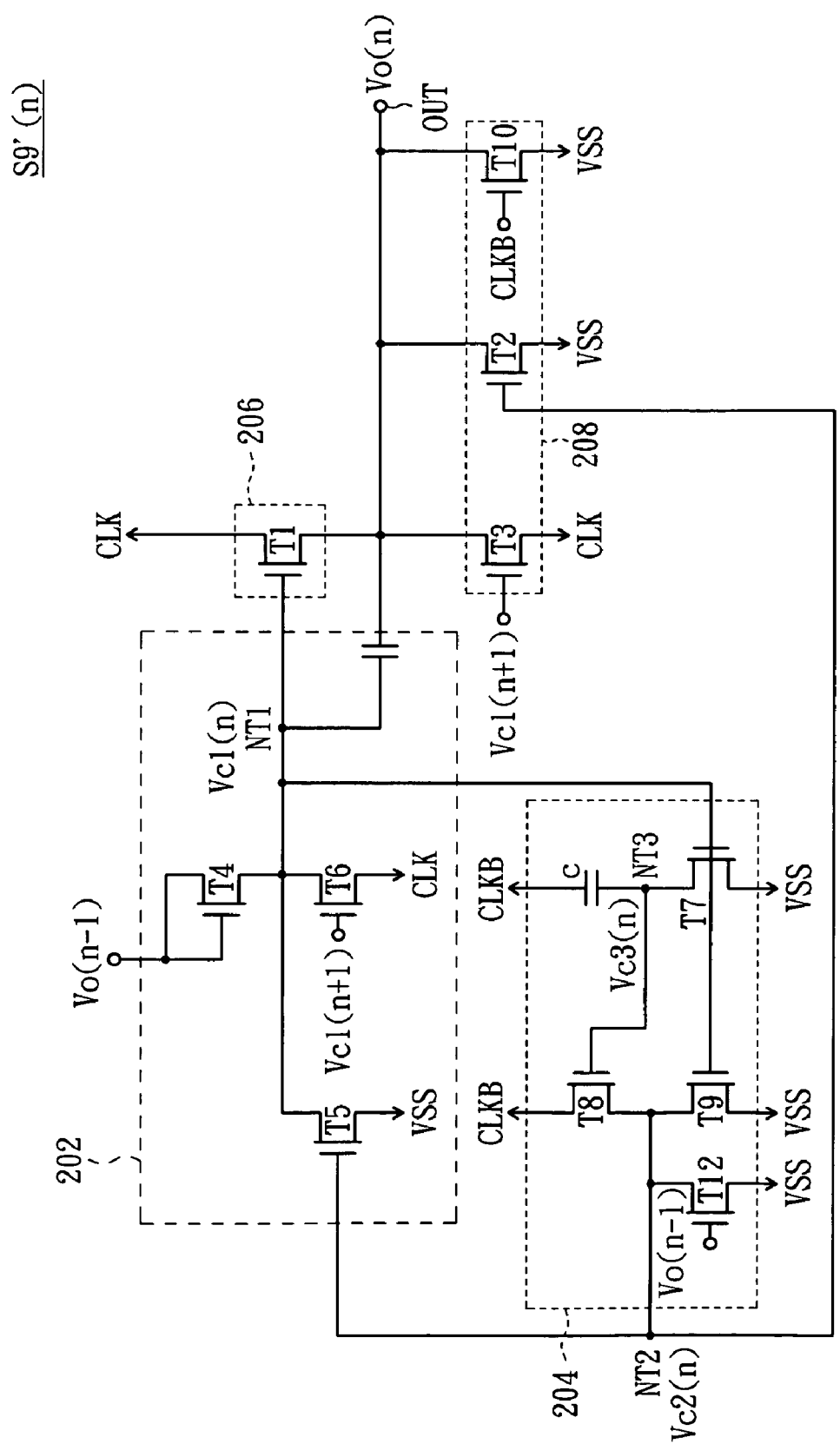
FIG. 27 is a detailed circuit diagram of the shift register unit in FIG. 6 according to the ninth example of the second embodiment.
Figure 28:
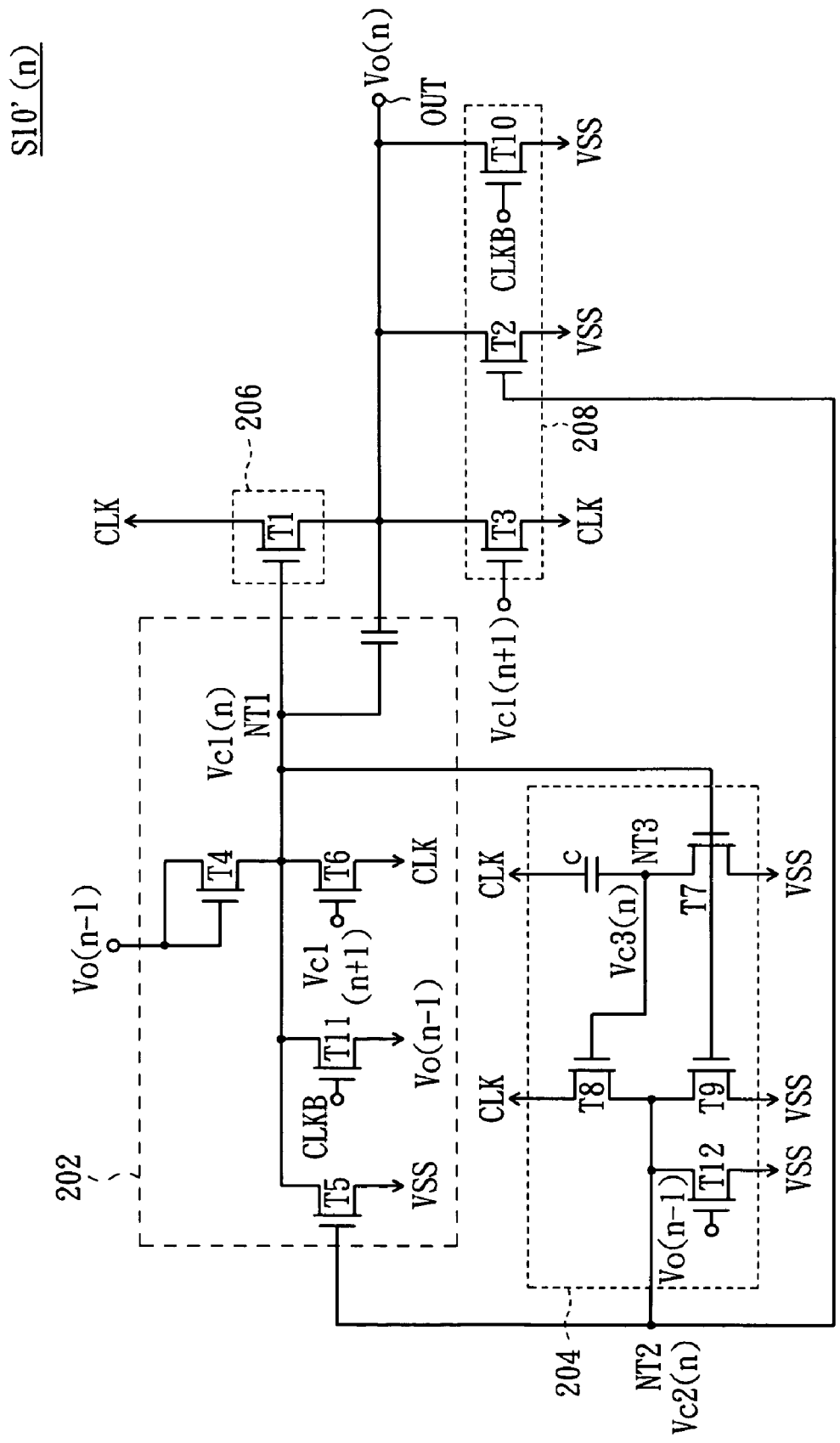
FIG. 28 is a detailed circuit diagram of the shift register unit in FIG. 6 according to the tenth example of the second embodiment.
Figure 29:
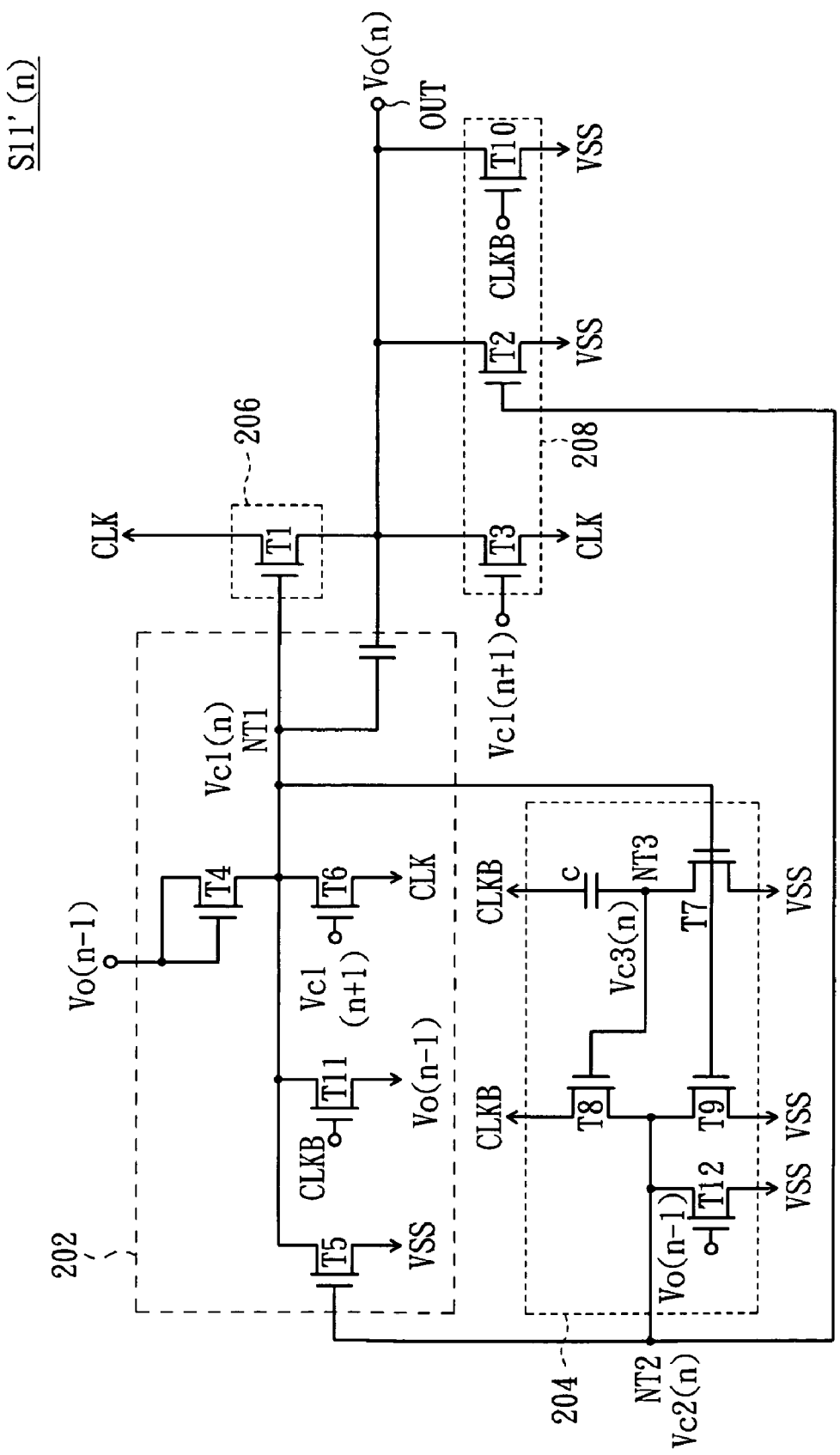
FIG. 29 is a detailed circuit diagram of the shift register unit in FIG. 6 according to the eleventh example of the second embodiment.

Referring to FIGS. 23-25, detailed circuit diagrams of the shift register unit of FIG. 15 according to the eighth, the ninth, and the tenth examples of the third embodiment are shown. The shift register units U8'(n), U9'(n), and U10'(n) are respectively the derivative circuits of the corresponding shift register units in the fourth to the sixth examples of the third embodiment. The level controller 204 of each shift register unit U8'(n), U9'(n) or U10'(n) has the transistor T12 for controlling the control signal Vc2(n) to be equal to the voltage VSS in the time period TP1. Besides, the transistors T3 and T6 of the corresponding examples are replaced by the transistors T3' and T6' in the eighth to tenth examples. Therefore, the operations of the shift register units U8'(n), U9'(n), and U10'(n) can be reasoned according to those of the fourth to sixth examples by analog.

Although the transistor T12 is exemplified to be disposed in the circuit having the transistors T6' and T3' respectively in the driving unit 202 and the level lowering unit 208 for illustration in the eight to the tenth examples, the transistor T12 can also be disposed in the circuit having the transistors T6 and T3 respectively in the driving unit 202 and the level lowering unit 208 as shown in FIGS. 26-29. The relevant operations can be reasoned according to those of the third to the sixth examples by analog.

Example Eleventh to Thirteenth

Figure 30:
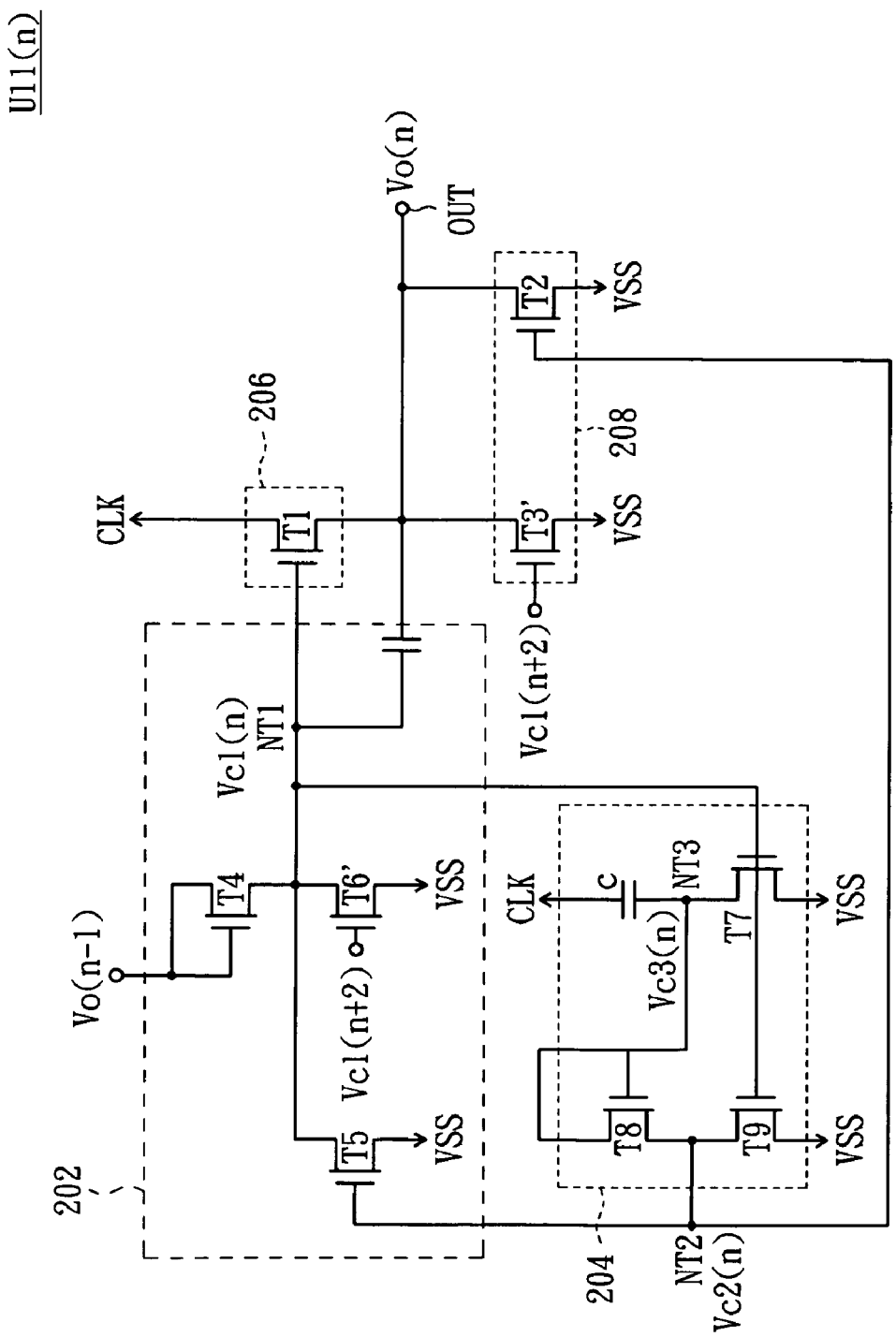
FIG. 30 is a detailed circuit diagram of the shift register unit in FIG. 14 according to the eleventh example of the third embodiment.
Figure 31:
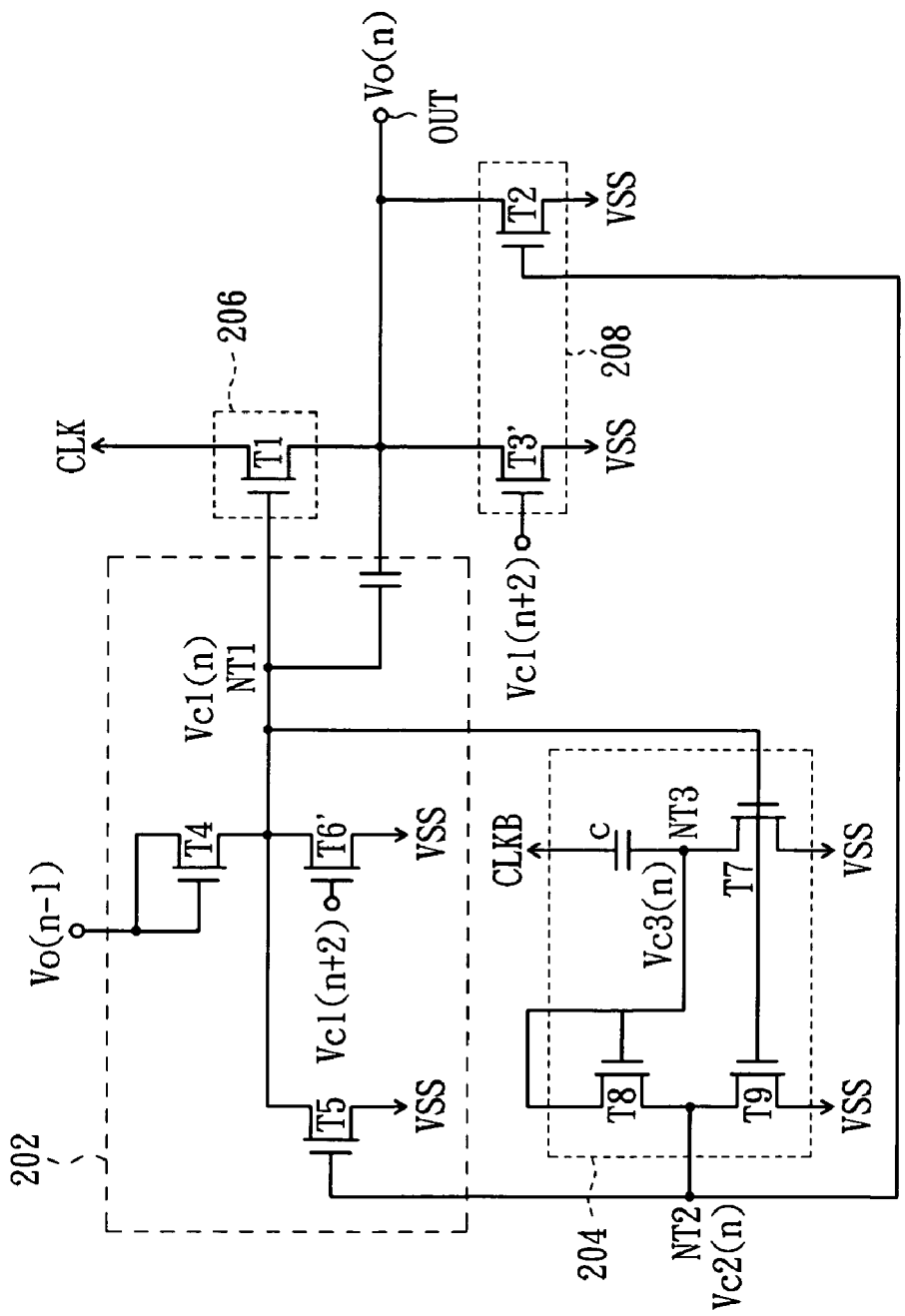
FIG. 31 is a detailed circuit diagram of the shift register unit in FIG. 15 according to the twelfth example of the third embodiment.
Figure 32:
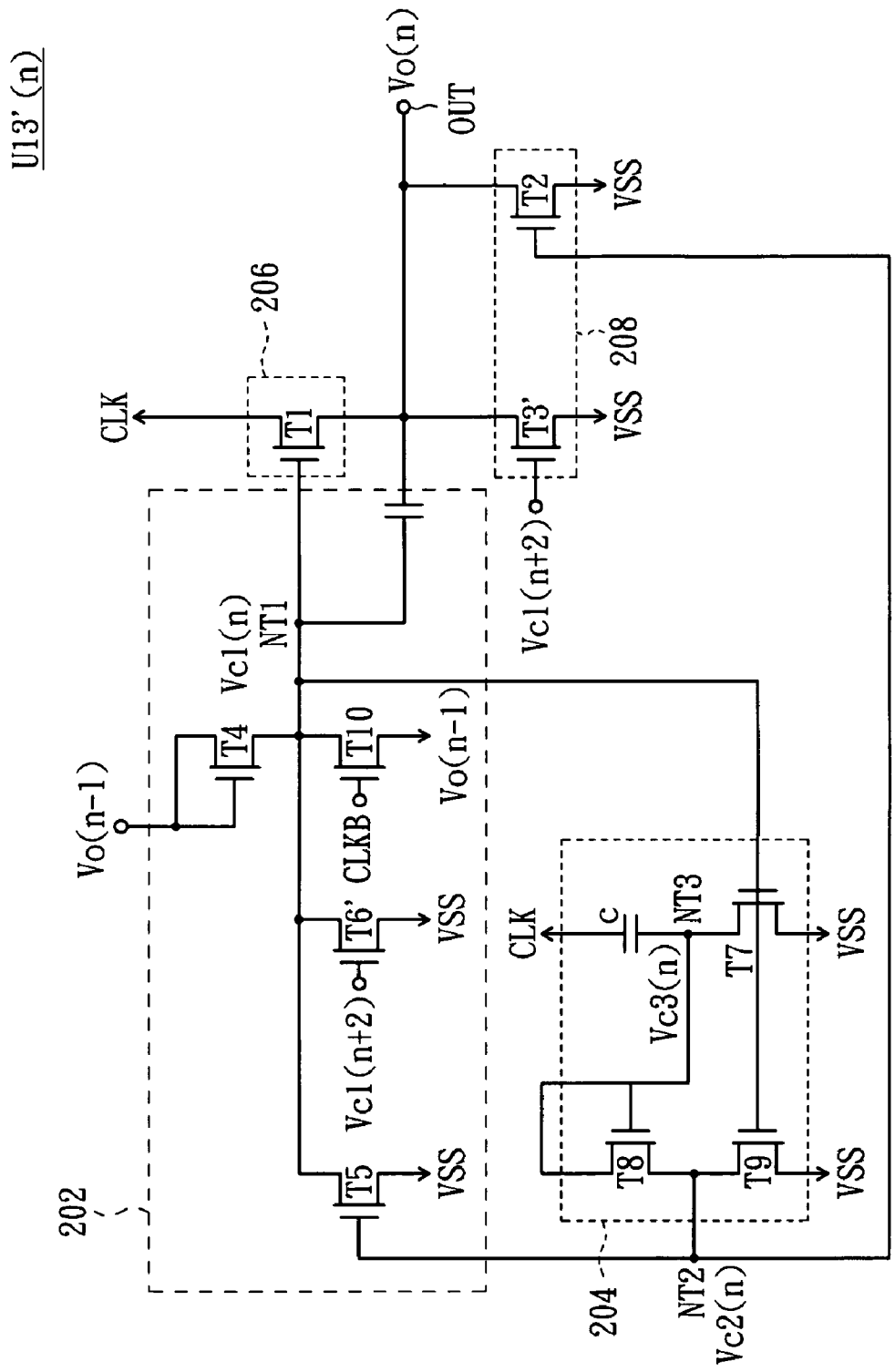
FIG. 32 is a detailed circuit diagram of the shift register unit in FIG. 15 according to the thirteenth example of the third embodiment.

Referring to FIG. 30, and FIGS. 31 and- 32, FIG. 30 shows a detailed circuit diagram of the shift register unit of FIG. 14 according to eleventh example of the third embodiment, and FIGS. 31 and 32 respectively show detailed circuit diagrams of the shift register unit of FIG. 15 according to the twelfth and the thirteenth examples of the third embodiment. The shift register units U11(n), U12'(n), and U13'(n) are respectively the derivative circuits of the corresponding shift register units in the seventh to the ninth examples of the first embodiment, which replaces the transistors T3 and T6 of the corresponding examples of the first embodiment by the transistors T3' and T6'. Therefore, the operations of the shift register units U11(n), U12'(n) and U13'(n) can be reasoned according to those in the first embodiment by analog.

Although the shift register unit S(n) is exemplified to a circuit structure including the transistors T1-T9 or the transistors T1-T10 for illustration, the circuit structures of the driving unit, the level controller, the level lifting unit and the level lowering unit of the shift register unit in the embodiment of the invention are not limited thereto, but can have other alternatives.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A shift register, comprising a plurality of stages of shift register units, each stage of shift register unit generating a scan signal and comprising:
   a first level lifting unit, for controlling the scan signal to be equal to a first timing signal in response to a high level of a first control signal;
   a first level lowering unit, for controlling the scan signal to be equal to a first voltage in response to a high level of a second control signal;
   a first driving unit, for providing the first control signal to turn on the first level lifting unit in response to a rising edge of an input signal; and
   a level controller, for receiving the first control signal and accordingly outputting the second control signal at an output terminal, the level controller comprising:
      an input unit, for controlling a third control signal to be equal to the first voltage at a first node in response to a rising edge of the first control signal;
      a charge storage unit, having one end coupled to the first node and the other end for receiving a second timing signal, wherein the charge storage unit is for storing an electric charge induced by the second timing signal;
      a second level lifting unit, for controlling the second control signal to be substantially equal to the third control signal so as to turn on the first level lowering unit in response to a rising edge of the third control signal; and
      a second level lowering unit, for controlling the second control signal to be equal to the first voltage so as to turn off the first level lowering unit in response to the rising edge of the first control signal;
   wherein the input signal inputted to the first driving unit of the corresponding stage of shift register unit is a scan signal outputted by a previous stage of shift register unit;
   wherein the first level lowering unit of n-th stage of shift register unit further comprises a transistor, having a gate for receiving the first control signal of the (n+1)-th stage of shift register unit, a drain coupled to the output terminal of the n-th stage of shift register unit and, a source for receiving the first timing signal, wherein n is a natural number.

2. The shift register according to claim 1, wherein the input unit comprises a second transistor, and the second transistor has a gate for receiving the first control signal, a drain coupled to the first node, and a source for receiving the first voltage.

3. The shift register according to claim 1, wherein the second level lifting unit comprises a second transistor, and the second transistor has a gate for receiving the third control signal, a drain for receiving the second timing signal, and a source coupled to the output terminal.

4. The shift register according to claim 1, wherein the second level lifting unit comprises a second transistor, and the second transistor has a gate and a drain for receiving the third control signal, and a source coupled to the output terminal.

5. The shift register according to claim 1, wherein the second level lowering unit comprises a second transistor, and the second transistor has a gate for receiving the first control signal, a drain coupled to the output terminal, and a source for receiving the first voltage.

6. The shift register according to claim 1, wherein the second timing signal is equal to the first timing signal.

7. The shift register according to claim 1, wherein the second timing signal is inverse in phase to the first timing signal.

8. The shift register according to claim 1, wherein the first level lifting unit comprises a second transistor, and the second transistor has a gate for receiving the first control signal, a first drain/source for receiving the first timing signal, and a second drain/source coupled to the output terminal of the corresponding shift register unit.

9. The shift register according to claim 1, wherein the first level lowering unit comprises a second transistor, and the second transistor has a gate for receiving the second control signal, a drain coupled to the output terminal of the corresponding shift register unit, and a source for receiving the first voltage.

10. The shift register according to claim 1, wherein the first driving unit comprises.
   a second transistor, having a gate and a drain for receiving the input signal, and a source coupled to the first level lifting unit at a second node.

11. The shift register according to claim 10, wherein the first driving unit of the n-th stage of shift register unit further comprises:
   an second transistor, having a gate for receiving the first control signal of the (n+1)-th stage shift register unit, a drain coupled to the second node, and a source for receiving the first timing signal, wherein n is a natural number.

12. A shift register, comprising a plurality of stages of shift register units, each stage of shift register unit generating a scan signal and comprising:

a first level lifting unit, for controlling the scan signal to be equal to a first timing signal in response to a high level of a first control signal;

a first level lowering unit, for controlling the scan signal to be equal to a first voltage in response to a high level of a second control signal;

a first driving unit, for providing the first control signal to turn on the first level lifting unit in response to a rising edge of an input signal; and a level controller, for receiving the first control signal and accordingly outputting the second control signal at an output terminal, the level controller comprising:
   an input unit, for controlling a third control signal to be equal to the first voltage at a first node in response to a rising edge of the first control signal;
   a charge storage unit, having one end coupled to the first node and the other end for receiving the first timing signal, wherein the charge storage unit is for storing an electric charge induced by the first timing signal;
   a second level lifting unit, for controlling the second control signal to be substantially equal to the third control signal so as to turn on the first level lowering unit in response to a rising edge of the third control signal; and
   a second level lowering unit, for controlling the second control signal to be equal to the first voltage so as to turn off the first level lowering unit in response to the rising edge of the first control signal;

wherein the input signal into the first driving unit of the corresponding stage of shift register unit is a scan signal outputted by a previous stage of shift register unit;

wherein the first level lowering unit comprises a transistor having a gate for receiving the second control signal, a drain coupled to the output terminal of the corresponding shift register unit, and a source for receiving the first voltage;

wherein, the first level lowering unit of the n-th stage of shift register unit further comprises another transistor having a gate for receiving the first control signal of the (n+1)-th stage of shift register unit, a drain coupled to the output terminal of the n-th stage of shift register unit and, a source for receiving the first timing signal, wherein n is a natural number.

* * * * *